United States Patent
Song et al.

(10) Patent No.: US 12,183,738 B2
(45) Date of Patent: Dec. 31, 2024

(54) CROSS-COUPLED GATE DESIGN FOR STACKED DEVICE WITH SEPARATED TOP-DOWN GATE

(71) Applicant: SAMSUNG ELECTRONICS CO., LTD., Suwon-si (KR)

(72) Inventors: Seunghyun Song, Albany, NY (US); Seungyoung Lee, Albany, NY (US); Saehan Park, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 332 days.

(21) Appl. No.: 17/221,355

(22) Filed: Apr. 2, 2021

(65) Prior Publication Data

US 2022/0246610 A1    Aug. 4, 2022

Related U.S. Application Data

(60) Provisional application No. 63/143,206, filed on Jan. 29, 2021.

(51) Int. Cl.
*H01L 27/092*    (2006.01)
*H01L 21/822*    (2006.01)
(Continued)

(52) U.S. Cl.
CPC ........ *H01L 27/092* (2013.01); *H01L 21/8221* (2013.01); *H01L 21/823807* (2013.01);
(Continued)

(58) Field of Classification Search
CPC . H01L 27/085–0922; H01L 21/8238–823871; H01L 29/42372–4238;
(Continued)

(56) References Cited

U.S. PATENT DOCUMENTS 9,419,003 B1     8/2016    Colinge et al.
10,109,637 B1    10/2018   Zang et al.
(Continued)

FOREIGN PATENT DOCUMENTS

EP     3678170 A1  *  7/2020    .......... H01L 27/0886

OTHER PUBLICATIONS

Communication dated Jun. 14, 2022 issued by the European Patent Office in application No. 22151755.0.
(Continued)

*Primary Examiner* — Marcos D. Pizarro
(74) *Attorney, Agent, or Firm* — Sughrue Mion, PLLC

(57) ABSTRACT

A semiconductor device and a method of manufacturing the same are provided. The semiconductor device includes a cross-coupled gate circuit in a three-dimensional (3D) stack including a plurality of transistors, a first gate line of a first transistor among the plurality of transistors connected to a fourth gate line of a fourth transistor among the plurality of transistors, a second gate line of a second transistor among the plurality of transistors connected to a third gate line of a third transistor among the plurality of transistors, a first conductor connecting the first gate line and the fourth gate line, a second conductor connecting the second gate line and the third gate line. The first gate line and the second gate line are arranged above the third gate line and the fourth gate line, respectively.

14 Claims, 19 Drawing Sheets

(51) Int. Cl.
  *H01L 21/8238* (2006.01)
  *H01L 27/06* (2006.01)
  *H01L 29/423* (2006.01)
  *H10B 10/00* (2023.01)

(52) U.S. Cl.
  CPC ............. *H01L 21/823828* (2013.01); *H01L 21/823871* (2013.01); *H01L 27/0688* (2013.01); *H01L 29/4238* (2013.01); *H01L 29/42392* (2013.01); *H10B 10/125* (2023.02)

(58) Field of Classification Search
  CPC ............. H01L 27/0688; H01L 27/088; H01L 27/0886; H01L 27/092; H01L 27/0924–0928; H01L 21/823807; H01L 21/823821; H01L 21/823828; H01L 21/823871–823871; H01L 29/42392; H01L 21/8221; H10B 10/125
  USPC ....................................................... 257/369
  See application file for complete search history.

(56) References Cited

U.S. PATENT DOCUMENTS

| | | | |
|---|---|---|---|
| 10,297,512 B2 | 5/2019 | Balakrishnan et al. | |
| 10,475,929 B2 | 11/2019 | Van Dal | |
| 10,483,166 B1 | 11/2019 | Cheng et al. | |
| 10,529,724 B2 | 1/2020 | Zang et al. | |
| 10,573,643 B2* | 2/2020 | Do | H01L 27/0705 |
| 10,593,681 B1 | 3/2020 | Rubin | |
| 2015/0137249 A1* | 5/2015 | Lin | H01L 27/0688 257/773 |
| 2018/0122793 A1* | 5/2018 | Moroz | H01L 29/78642 |
| 2019/0172828 A1* | 6/2019 | Smith | B82Y 10/00 |
| 2020/0135718 A1* | 4/2020 | Liebmann | H01L 23/5286 |
| 2020/0219970 A1* | 7/2020 | Mannebach | H01L 29/785 |
| 2020/0365469 A1 | 11/2020 | Yamashita et al. | |
| 2020/0411430 A1* | 12/2020 | Mannebach | H01L 29/66439 |
| 2020/0411516 A1* | 12/2020 | Sue | H01L 23/528 |
| 2021/0043630 A1* | 2/2021 | Liebmann | H01L 27/0688 |
| 2021/0242125 A1 | 8/2021 | Do | |

OTHER PUBLICATIONS

Smith, J., "Design Technology Co-Optimization Approaches for Integration and Migration to CFET and 3D Logic", Tokyo Electron, Apr. 3, 2019, pp. 2-29 (30 pages).

Communication dated Sep. 14, 2022 issued by the European Patent Office in counterpart European Application No. 22151755.0.

* cited by examiner

<B-B'>

<C-C'>

<D-D'>

CROSS-COUPLED GATE DESIGN FOR STACKED DEVICE WITH SEPARATED TOP-DOWN GATE

CROSS-REFERENCE TO THE RELATED APPLICATION

This application is based on and claims priority to U.S. Provisional Application No. 63/143,206 filed on Jan. 29, 2021, in the United States Patent and Trademark Office, the disclosure of which is incorporated by reference herein in its entirety.

BACKGROUND

1. Field

One or more embodiments of the disclosure relate to a semiconductor device, and more particularly, to a cross-coupled gate design for a 3D stacked device, and a method of manufacturing the same.

2. Description of the Related Art

The size of transistors continues to shrink in order to sustain scaled down logic circuits in electronic devices. However, as the continuous reduction in the size of transistors faces physical limits, planar-structured transistors have evolved into gate all-around structures, such as FinFET and MBCFET, to concentrate more transistors in a certain area size and to place more control over a channel and a gate of a transistor.

In this ongoing line of scaling and restructuring, 3D stacked devices are currently being studied to develop a semiconductor device that provides higher density in transistor integration. The 3D stacked device is relatively a new concept, and there is no clear cross-coupled gate design for a 3D stacked device. In general, transistors in 3D stacked structures are simply layered and do not greatly enhance the performance gain. In addition, the process of manufacturing and controlling these transistors in the 3D stacked device becomes more complex while not realizing the desired 50% area shrink. For example, one of these 3D stacked devices include a cross-coupled gate layout that requires dummy transistors. However, the existence of dummy transistors in the 3D stacked device increases the chip size.

Therefore, there is a need for a 3D stacked device without using dummy transistors in the cross-coupled gate design to enhance the performance gain while maintaining the chip size as small as possible.

SUMMARY

According to one or more embodiments, there is provided a semiconductor device including: a cross-coupled gate circuit including a plurality of transistors; a first gate line of a first transistor among the plurality of transistors connected to a fourth gate line of a fourth transistor among the plurality of transistors; a second gate line of a second transistor among the plurality of transistors connected to a third gate line of a third transistor among the plurality of transistors; wherein the first gate line and the second gate line are arranged above the third gate line and the fourth gate line, respectively.

According to one or more embodiments, there is provided a method of manufacturing a semiconductor device including a cross-coupled gate circuit. The method includes providing top gate lines with a first channel layer passing through the top gate lines and bottom gate lines with a second channel layer passing through the bottom gate lines on a carrier substrate, the top gate lines including a first gate line and a second gate line and the bottom gate lines including a third gate line and a fourth gate line; depositing a first contact on the first gate line and a second contact on the second gate line; flipping the carrier substrate such that the bottom gate lines are arranged above the top gate lines; depositing a first via and a second via on the first contact and the second contact, respectively; and depositing a third contact on the fourth gate line and a fourth contact on the third gate line.

According to one or more embodiments, there is provided a method of manufacturing a semiconductor device including a cross-coupled gate circuit. The method includes providing top gate lines with a first channel layer passing through the top gate lines and bottom gate lines with a second channel layer passing through the bottom gate lines on a carrier substrate, the top gate lines including a first gate line and a second gate line and the bottom gate lines including a third gate line and a fourth gate line; performing a gate cutting on the first gate line and the second gate line; depositing a first via and a second via on a top surface of the third gate line and a top surface of the fourth gate line, respectively; and depositing a first contact on the first via and a second contact on the second via.

BRIEF DESCRIPTION OF THE DRAWINGS

The above and other aspects, features, and advantages of certain embodiments of the disclosure will be more apparent from the following description taken in conjunction with the accompanying drawings in which.

DETAILED DESCRIPTION

Figure 1:
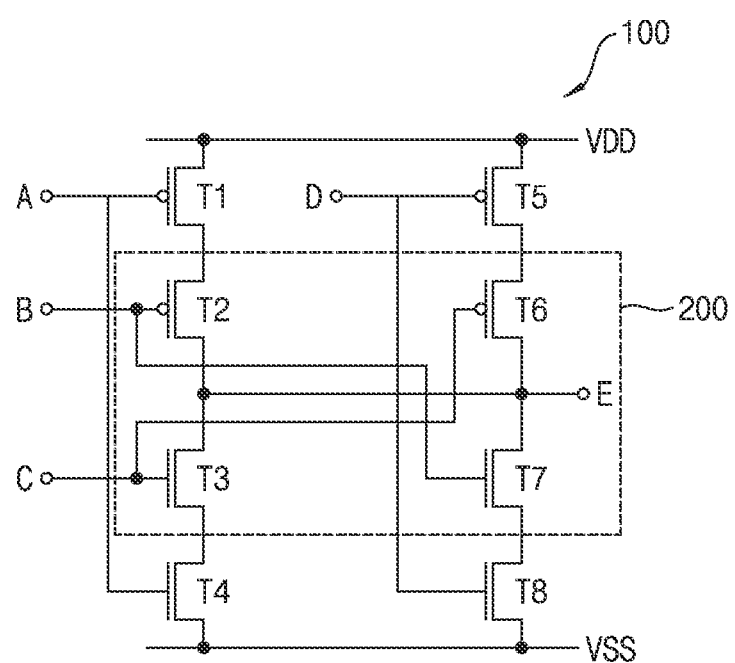
FIG. 1 is a circuit diagram illustrating an example of a cross-coupled gate circuit.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents, but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

One or more embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the one or more embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Further, in the drawings, the sizes and relative sizes of layers and regions may be exaggerated for clarity.

For the sake of brevity, conventional elements to semiconductor devices may or may not be described in detail herein. However, even if a certain element is described or illustrated in a semiconductor device in this disclosure, the element may not be included in a claimed semiconductor device unless the element is recited as being included in the claimed semiconductor device.

FIG. 1 is a circuit diagram illustrating an example of a cross-coupled gate circuit.

Referring to FIG. 1, a circuit 100 includes eight (8) transistors T1 through T8 (e.g., metal-oxide semiconductor field effect transistor (MOSFET)). The circuit 100 includes a cross-coupled gate circuit 200 that consists of two (2) n-type metal-oxide semiconductor (NMOS) transistors T2 and T6, and two (2) p-type metal-oxide semiconductor (PMOS) transistors T3 and T7. Here, a gate of NMOS transistor T2 is coupled to a gate of PMOS transistor T7, and a gate of PMOS transistor T3 is coupled to a gate of NMOS transistor T6. At a high level, the cross-coupled circuit 200 shown in FIG. 1 may make up a flip-flop, which may be used as a fundamental building block to construct various digital electronic devices, such as a memory cell.

In a non-stacked device, the gates of transistors T2, T3, T6 and T7 of the cross-coupled gate circuit 200 are generally connected through middle-of-line (MOL) contacts. However, it is difficult to apply the MOL contacts to a cross-coupled gate circuit in a 3D stacked device because inputs of top gates and inputs of bottom gates need to be separated and twisted in a limited space.

Figure 2A:
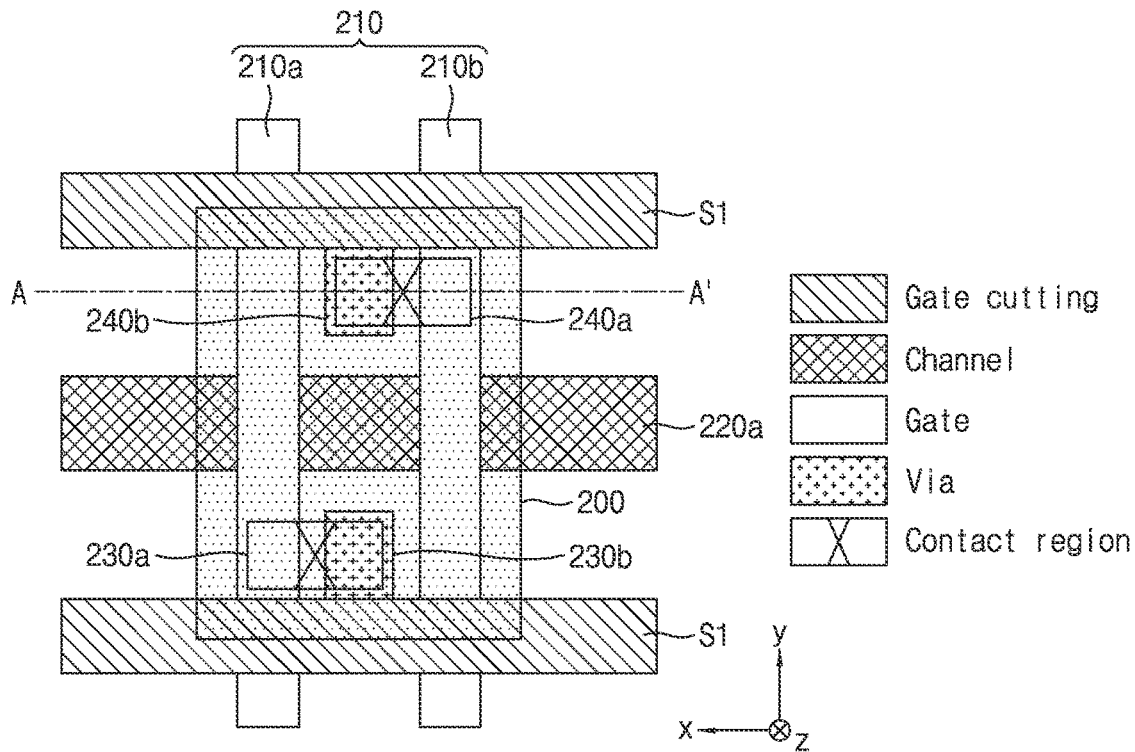
FIG. 2A is a diagram illustrating a top view of a cross-coupled gate circuit provided in a 3D stacked device according to an embodiment.

FIG. 2A is a diagram illustrating a top view of a cross-coupled gate circuit in a 3D stacked device according to an embodiment.

According to an embodiment, a cross-coupled gate circuit 200 (shown in FIG. 1) may include a first gate 210a and a second gate 210b (collectively referred to as "top gates"), a first channel 220a, a first contact region 230a, a second contact region 240a, a first via 230b and a second via 240b. For example, the top gates may be gates of NMOS transistors. However, the one or more embodiments are not limited thereto, and the top gates may be gates of PMOS transistors. In addition, a gate of a transistor may be also referred to as "gate line."

The first channel 220a may pass or penetrate through the first gate 210a and the second gate 210b. The first via 230b may be disposed between the first gate 210a and the second gate 210b. The first contact region 230a may be disposed on the first gate 210 and the first via 230 so as to connect the first via 230b and the first gate 210a. Similarly, the second via 240b may be disposed between the first gate 210a and the second gate 210b. The second contact region 240a may be disposed on the second gate 210b and the second via 240b so as to connect the second via 240b and the second gate 210b. The first via 230b and the second via 240b may be disposed such that they are opposite from each other with respect to the channel 220a therebetween. The first contact region 230a, the second contact region 240a, the first via 230b, and the second via 240b may be a metal or a metal containing material, such as copper (Cu), aluminum (Al), silver (Ag), tin (Sn), gold (Au), nickel (Ni), lead (Pb), titanium (Ti), or alloys thereof. However, the material of contact regions and vias are not limited thereto, and may include any other material that is capable of conducting electricity.

Figure 2B:
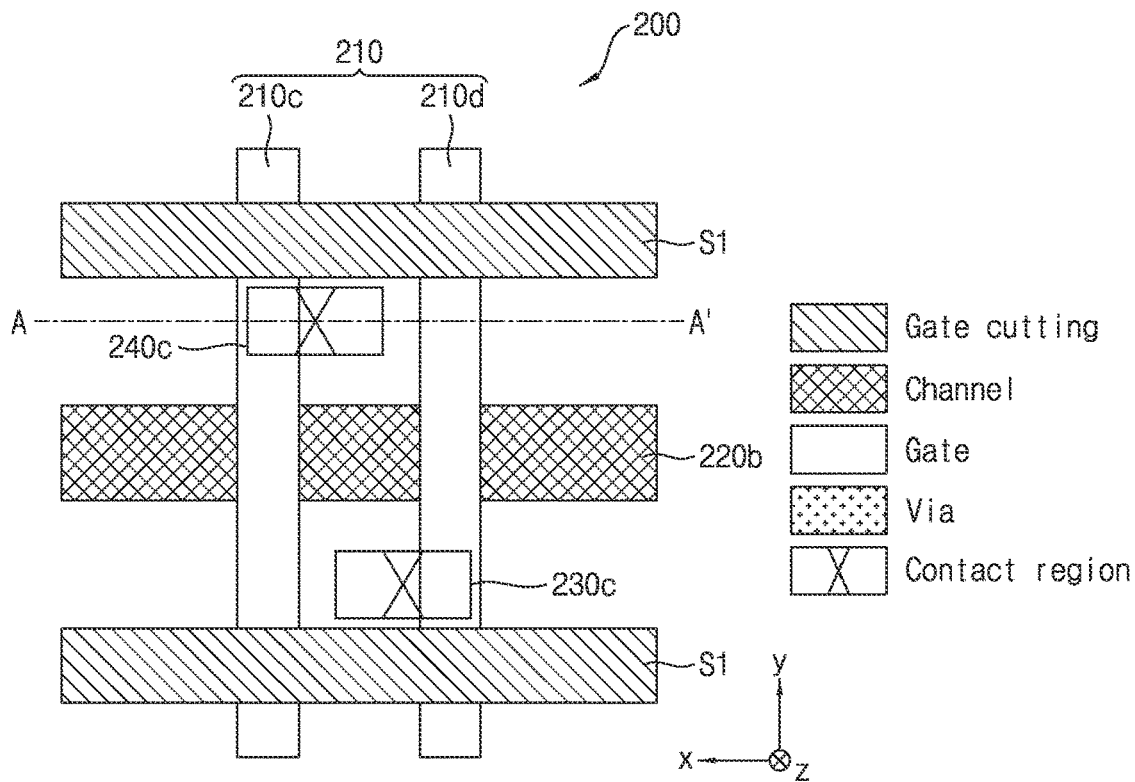
FIG. 2B is a diagram illustrating a bottom view of a cross-coupled gate circuit provided in a 3D stacked device according to an embodiment.

FIG. 2B is a diagram illustrating a bottom view of a cross-coupled gate circuit in a 3D stacked device according to an embodiment.

Referring to FIG. 2B, the cross-coupled gate circuit 200 may include a third gate 210c and a fourth gate 210d (collectively referred to as "bottom gates"), a channel 220b, a third contact region 230c and a fourth contact region 240c. For example, the bottom gates may be gates of PMOS transistors. However, the one or more embodiments are not limited thereto, and the bottom gates may be gates of NMOS transistors.

The channel 220b may pass or penetrate through the third gate 210c and the fourth gate 210d. The third gate 210c may be disposed on the fourth contact region 240c, and the fourth gate 210d may be disposed on the third contact region 230c. The first via 230b may be disposed on the third contact region 230c and the second via 240b may be disposed on the fourth contact region 240c. As described above with reference to FIG. 2A, one end of the first via 230b is connected to the first contact region 230a, which is connected to the first gate 210a. In FIG. 2B, the other end of the first via 230b is connected to the third contact region 230c, which is connected to the fourth gate 210d, thereby, coupling the first gate 210a and the fourth gate 210d. Similarly, one end of the second via 240b is connected to the second contact region 240a, which is connected to the second gate 210b. The other end of the second via 240b is connected to the fourth contact region 240c, which is connected to the third gate 210c, thereby coupling the second gate 210b and the third gate 210c.

Moreover, a gate cutting S1 may be performed on the gates 210 so as to separate or partition the cross-coupled gate circuit 200 from other circuits. A gate cutting may include, for example, depositing dielectric material to insulate gates of transistors.

Figure 2C:
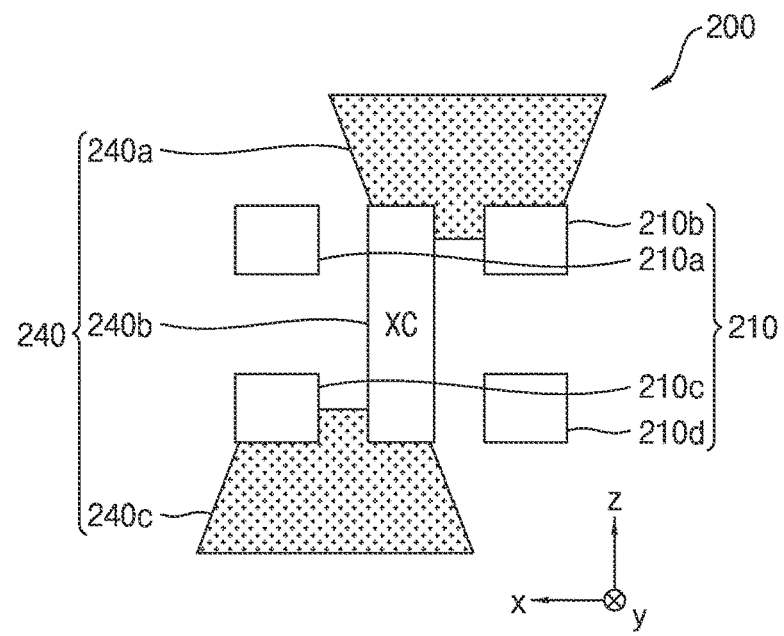
FIG. 2C is a diagram illustrating a front view of a cross-coupled gate circuit provided in a 3D stacked device taken along the line A-A' shown in FIG. 2A, according to an embodiment.

FIG. 2C is a diagram illustrating a front view of a cross-coupled gate circuit provided in a 3D stacked device taken along the line A-A' shown in FIG. 2A, according to an embodiment.

Referring to FIG. 2C, the second gate 210b and the third gate 210c are coupled by the first contact region 230a, the first via 230b and the third contact region 230c. Although not shown in FIG. 2C, the first gate 210a and the fourth gate 210d may be coupled in a manner similar to the second gate 210b and the third gate 210c, as described above with reference to FIGS. 2A and 2B. In addition, while the second contact region 240a, the second via 240b and the fourth contact region 240c are described as separate components or structures, they may be collectively referred to as a second conductor 240. Similarly, the first contact region 230a, the first via 230b and the third contact region 230c may be collectively referred to as a first conductor 230.

According to an embodiment, a top surface of the second gate 210b is connected to a bottom surface of the second contact region 240a, and a bottom surface of the third gate 210c is connected to a top surface of the fourth contact region 240c. Also, the second via 240b, disposed between the first gate 210a and the second gate 210b along the horizontal axis (i.e., x-axis), connects the bottom surface of the second contact region 240a and the top surface of the fourth contact region 240c so as to couple the second gate 210b and the third gate 210c. However, the one or more embodiments are not limited thereto, and may include any other structure to couple the second gate 210b and the third gate 210c. For example, the second contact region 240a may be disposed such that the second contact region 240a connects a side surface of the second gate 210b and a side surface of the third gate 210C. Similarly, the first contact region 230a may be disposed such that the first contact region 230a connects a side surface of the first gate 210a and a side surface of the fourth gate 210d.

Figure 2D:
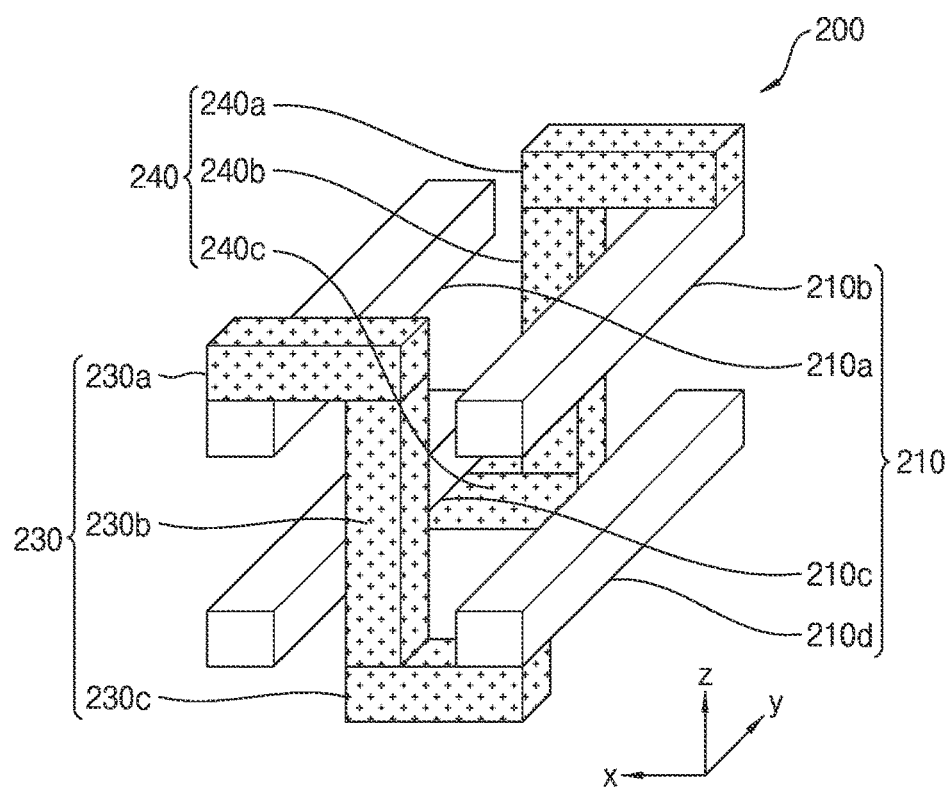
FIG. 2D is a diagram illustrating a perspective view of a cross-coupled gate circuit provided in a 3D stacked device according to an embodiment.

FIG. 2D is a diagram illustrating a perspective view of a cross-coupled gate circuit provided in a 3D stacked device according to an embodiment.

As described above with reference to FIGS. 2A through 2C, the first gate 210a may be coupled with the fourth gate 210d by the first conductor 230. The first conductor 230 may include the first contact region 230a, the first via 230b and the third contact region 230c. The first contact region 230a may be disposed on the first gate 210a and may extend in a horizontal direction (i.e., x-axis) from the first gate 210a toward the second gate 210b. The third contact region 230c may be disposed under the fourth gate 210d and extend in a horizontal direction from the fourth gate 210d toward the third gate 210c. The first via 230b may be disposed between the first gate 210a and the second gate 210b (or the third gate 210c and the fourth gate 210d) along the horizontal axis (i.e., x-axis) and extend along the z-axis so as to connect the bottom surface of the first contact region 230a and the top surface of the third contact region 230c.

Similarly, the second gate 210b may be coupled with the third gate 210c by the second conductor 240. The second conductor 240 may include the second contact region 240a, the second via 240b and the fourth contact region 240c. The second contact region 240a may be disposed on the second gate 210b and extend in a horizontal direction (i.e., x-axis) from the second gate 210b toward the first gate 210a. The fourth contact region 240c may be disposed under the third gate 210c and extend and extend in a horizontal direction from the third gate 210c toward the fourth gate 210d. The second via 240b may be disposed between the first gate 210a and the second gate 210b (or the third gate 210c and the fourth gate 210d) along the horizontal axis (i.e., x-axis) and extend along the z-axis so as to connect the bottom surface of the second contact region 240a and the top surface of the fourth contact region 240c.

Although not shown in FIGS. 2C and 2D, the channel 220a may be disposed so as to pass through the first gate 210a and the second gate 210b, and extend along the x-axis and the y-axis. Also, the channel 220b may be disposed so as to pass through the third gate 210c and the fourth gate 210d, and extend along the x-axis and the y-axis.

Accordingly, by coupling the first gate 210a with the fourth gate 210d and the second gate 210b with the third gate 210c, the cross-coupled gate circuit 200 may be formed in a 3D stacked device.

For the convenience of illustration, the shapes of the gates 210, the channels 220, the first conductor 230 and the second conductor 240 are illustrated as rectangular shapes. However, the shape of the gates 210, the channels 220, the first conductor 230 and the second conductor 240 are not limited thereto, and may include any other shape (e.g., cylindrical) that is suitable to construct a cross-coupled gate circuit in a 3D stacked structure.

Figure 3A:
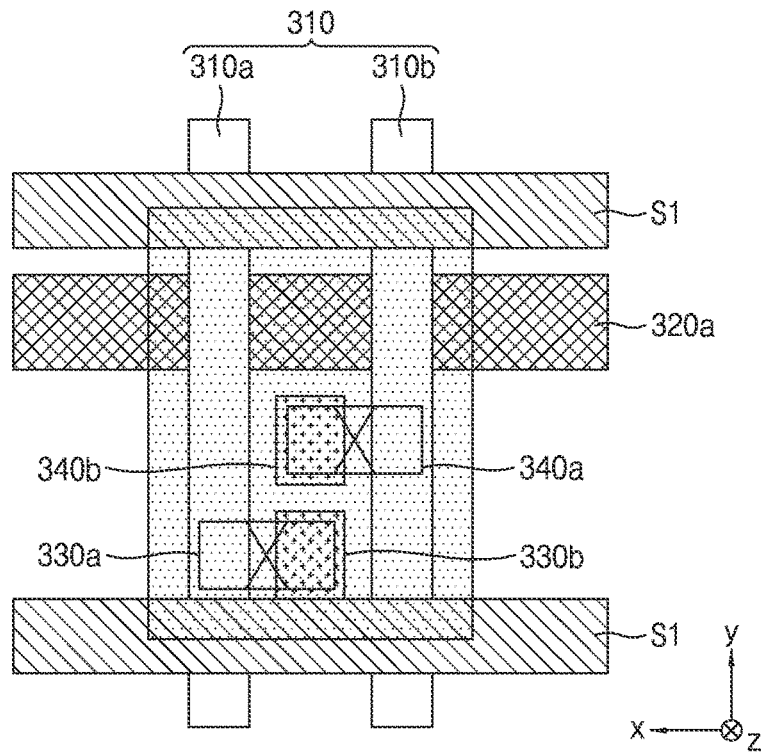
FIG. 3A is a diagram illustrating a top view of a cross-coupled gate circuit provided in a 3D stacked device according to another embodiment.
Figure 3B:
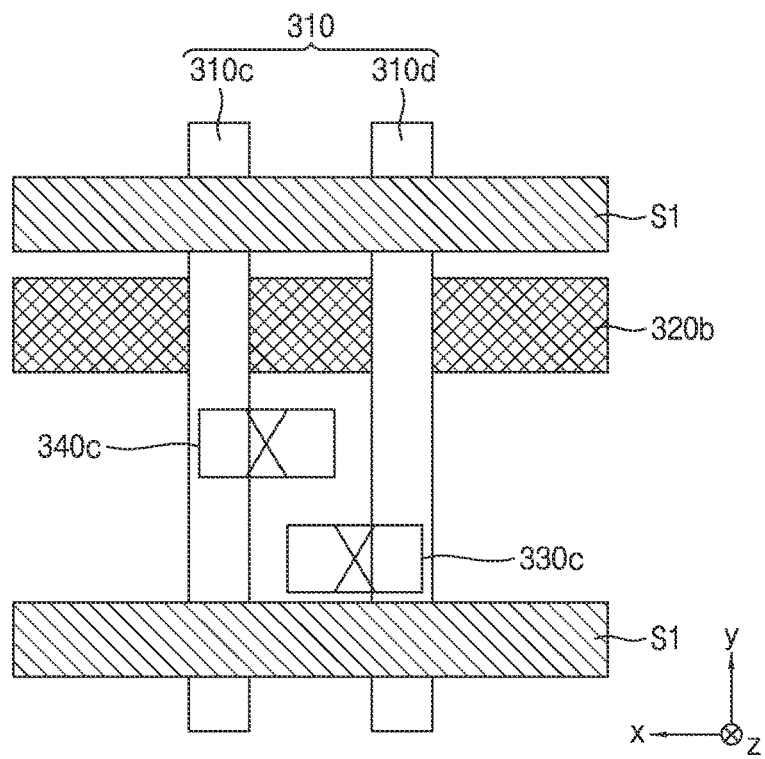
FIG. 3B is a diagram illustrating a bottom view of a cross-coupled gate circuit provided in a 3D stacked device according to another embodiment.

FIG. 3A is a diagram illustrating a top view of a cross-coupled gate circuit provided in a 3D stacked device according to another embodiment, and FIG. 3B is a diagram illustrating a bottom view of a cross-coupled gate circuit provided in a 3D stacked device according to another embodiment. For the brevity of description, description of the same or similar elements provided above will be omitted.

Referring back to FIG. 2A, the first conductor 230 and second conductor 240 are positioned such that the first conductor 230 and the second conductor 240 are opposite from each other with respect to the channel 220a therebetween.

Referring to FIG. 3A, according to another embodiment, the second conductor 340 may be disposed at a location different from the location of the second conductor 240 illustrated in FIG. 2A. That is, the second via 340b may be disposed at a location adjacent to the first via 330b along the y-axis, such that the channel 320a is not disposed between the first via 330b and the second via 340b. Here, the channel 320a is disposed adjacent to a side the second via 340b that is away from the first via 330b. According to the location of the second via 340b, the second contact region 340a may be disposed on the top surface of the second gate 310b and extend in a horizontal direction (i.e., x-axis) toward the second via 340b so as to connect the second gate 310b and the second via 340b.

Referring to FIG. 3B, the fourth contact region 340c may be disposed under the third gate 310c and extend along the horizontal direction (i.e., x-axis) from the third gate 310c toward the fourth gate 310d, so as to connect the bottom surface of the third gate 310c to the bottom surface of the second via 340b. Accordingly, the second gate 310b and the third gate 310c may be coupled to each other by the second contact region 340a, the second via 240b and the fourth contact region 340c (collectively, the second conductor 340) that are located at a location different from the location of the second conductor 240 shown in FIGS. 2A and 2B.

Figure 4A:
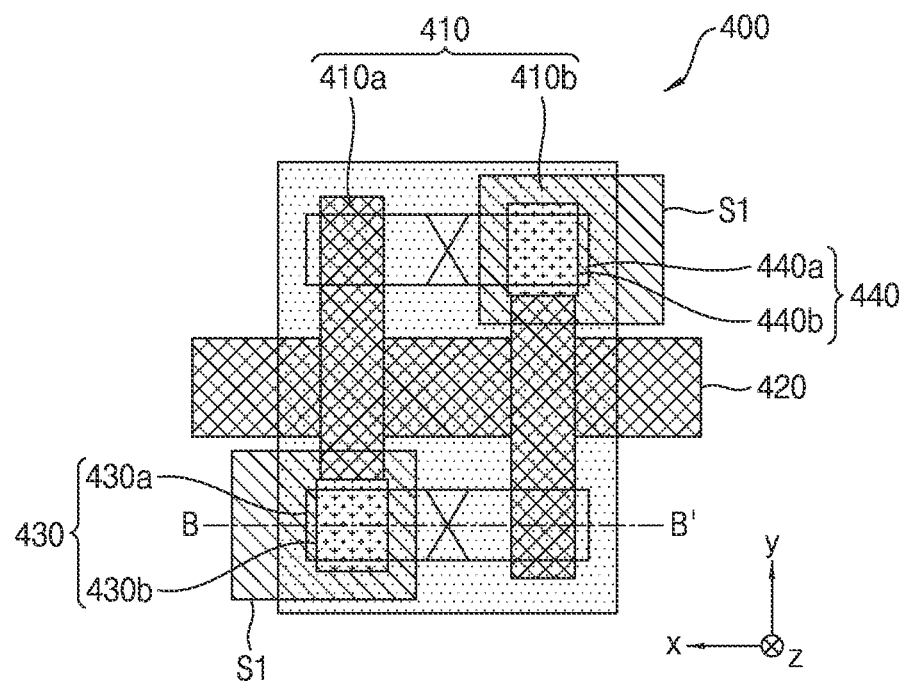
FIG. 4A is a diagram illustrating a top view of a cross-coupled gate circuit provided in a 3D stacked device according to another embodiment.

FIG. 4A is a diagram illustrating a top view of a cross-coupled gate circuit provided in a 3D stacked device according to another embodiment. For the brevity of description, description of the same or similar elements provided above will be omitted.

Referring to FIG. 4A, a cross-coupled gate circuit 400 may include a first gate 410a, a second gate 410b, a channel 420, a first conductor 430, and a second conductor 440. The channel 420 may be disposed so as to pass through the first gate 410a and the second gate 410b and extend in a horizontal direction (i.e., x-axis). The first conductor 430 may include a first contact region 430a and a first via 430b. The second conductor 440 may include a second contact region 440a and a second via 440b.

According to an embodiment, locations of the first via 430b and the second via 440b may be disposed directly on the top surface of the third gate 410c and the fourth gate 410d, respectively. In other words, the first contact region 430a may be disposed on the top surface of the second gate 410b and extend in the horizontal direction (i.e., x-axis) from the second gate 410b toward the first via 430b that is disposed directly on the top surface of the third gate 410c. The first contact region 430a may connect the second gate 410b with the first via 430b, which is connected to the third gate 410c disposed beneath the first via 430b. Similarly, the second contact region 440a may be disposed on the top surface of the first gate 410a and extend in the horizontal direction (i.e., x-axis) from the first gate 410a toward the second via 440b that is disposed directly on the top surface of the fourth gate 410d. The second contact region 440a may connect the first gate 410a with the second via 440b, which is connected to the fourth gate 410d disposed beneath the second via 440b. Accordingly, the first gate 410a may be coupled with the fourth gate 410d through the first conductor 430 and the second gate 410b may be coupled with the third gate 410c through the second conductor 440.

Furthermore, the gate cutting S1 may be performed in respective regions surrounding the first via 430b and the second via 440b such that the first gate 410a and the second gate 410b may be cut. In this embodiment, the first gate 410a is cut so that the first gate 410a does not contact the first conductor 430, which couples the second gate 410b and the third gate 410c. Otherwise, the first gate 410a, the second gate 410b and the third gate 410c may be connected, and such a configuration may disrupt the cross-coupled gate circuit design. Similarly, the second gate 410b is cut so that the second gate 410b does not contact the second conductor 440, which couples the first gate 410a and the fourth gate 410d. A product of the gate-cut structure is more readily shown in FIG. 4C, and will be described in more detail below with reference to FIG. 4C.

Figure 4B:
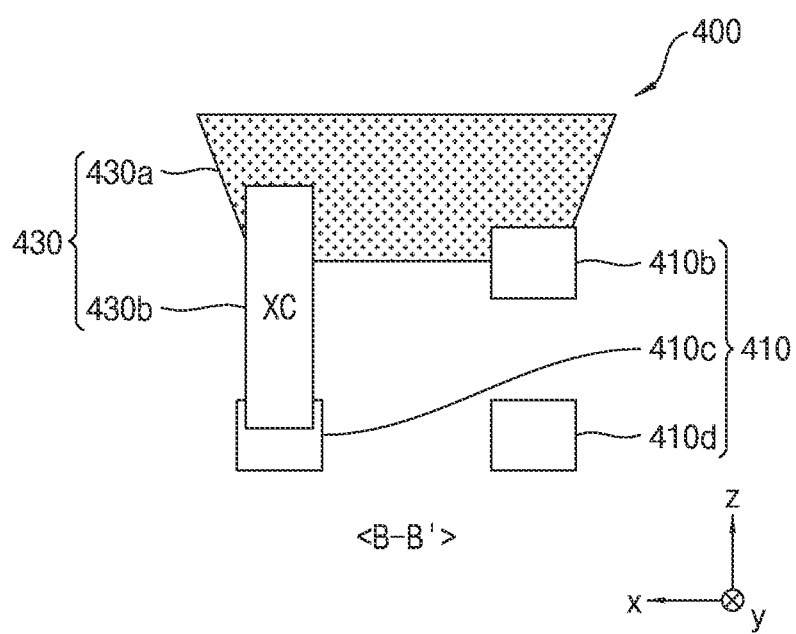
FIG. 4B is a diagram illustrating a front view of a cross-coupled gate circuit provided in a 3D stacked device taken along the line B-B' shown in FIG. 4A, according to another embodiment.

FIG. 4B is a diagram illustrating a front view of a cross-coupled gate circuit provided in a 3D stacked device taken along the line B-B' shown in FIG. 4A, according to another embodiment.

Referring to FIG. 4B, the second gate 410b and the third gate 410c are connected by the first conductor 430. Specifically, the first contact region 430a is disposed on the top surface of the second gate 410b and extend in the horizontal direction (i.e., x-axis) from the second gate 410b toward the first via 430b. The first via 430b extends along the z-axis and is disposed on the top surface of the third gate 410c. The top surface of the first via 430b is connected to the bottom surface of the contact region 430a so as to couple the second gate 410b and the third gate 410c through the first contact region 430a and the first via 430b. However, the one or more embodiments are not limited thereto, and may include any other structure to couple the second gate 210b and the third gate 210c.

Figure 4C:
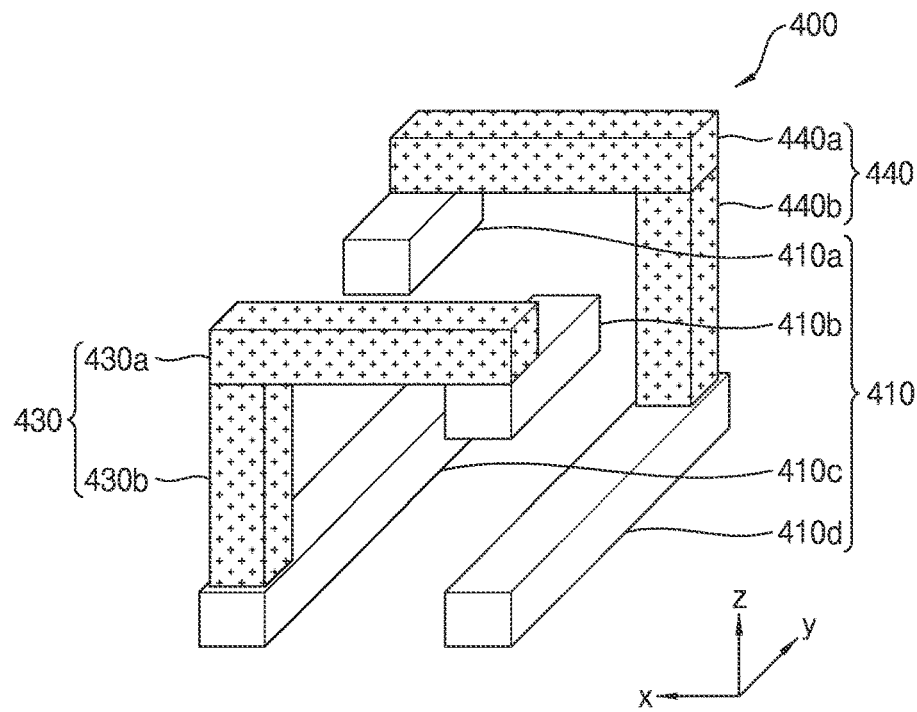
FIG. 4C is a diagram illustrating a perspective view of a cross-coupled gate circuit provided in a 3D stacked device according to another embodiment.

FIG. 4C is a diagram illustrating a perspective view of a cross-coupled gate circuit provided in a 3D stacked device according to another embodiment.

As described with reference to FIG. 4A, FIG. 4C shows a perspective view of a cross-coupled gate circuit 400 after the gate cutting S1. Referring to FIG. 4C, the first gate 410a is coupled with the fourth gate 410d by the second conductor 440. Specifically, one end of the second contact region 440a is disposed on the top surface of the first gate 410a, and the second contact region 440a extends in the horizontal direction (i.e., x-axis) from the first gate 410a to the second via 440b. The second via 440b extends in a vertical direction (i.e., z-axis) from the top surface of the fourth gate 410d to the bottom surface of the other end of the second contact region 440a, to connect the fourth gate 410d to the second contact region 440a. Accordingly, the first gate 410a and the fourth gate 410d are coupled through the second contact region 440a and the second via 440b.

Moreover, the second gate 410b is coupled with the third gate 410c by the first conductor 430. Specifically, one end of the first contact region 430a is disposed on the top surface of the second gate 410b, and the first contact region 430a extends in the horizontal direction (i.e., x-axis) from the second gate 410b to the first via 430b. The first via 430b extends in the vertical direction (i.e., z-axis) from the top surface of the third gate 410c to the bottom surface of the other end of the first contact region 430a, to connect the third gate 410c to the first contact region 430a. Accordingly, the second gate 410b and the third gate 410c are coupled through the first contact region 430a and the first via 430b.

As shown in FIG. 4C, the first gate 410a is cut so that it does not contact the first conductor 430. Similarly, the second gate 410b is cut so that it does not contact the second conductor 440. In addition, although not shown in FIGS. 4B and 4C, one or more channels may be disposed to pass through the gates 410.

For the convenience of illustration, the shapes of the gates 410, the channel 420, the first conductor 430 and the second conductor 440 are illustrated as rectangular shapes. However, the shape of the gates 410, the channel 420, the first conductor 430 and the second conductor 440 are not limited thereto, and may include any other shape that is suitable to construct a cross-coupled gate circuit in a 3D stacked structure.

Figure 5A:
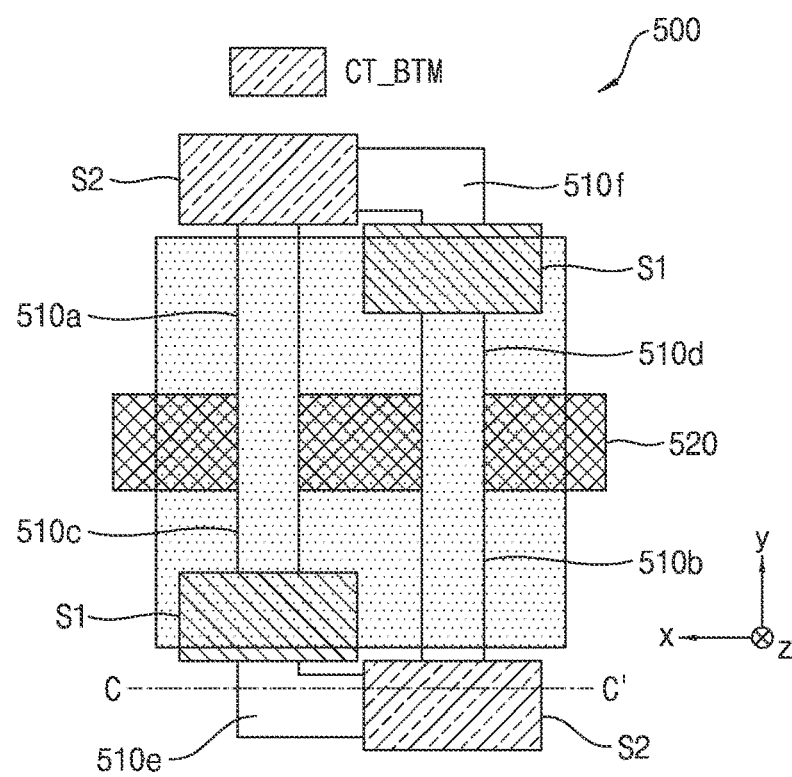
FIG. 5A is a diagram illustrating a top view of a cross-coupled gate circuit provided in a 3D stacked device according to another embodiment.
Figure 5B:
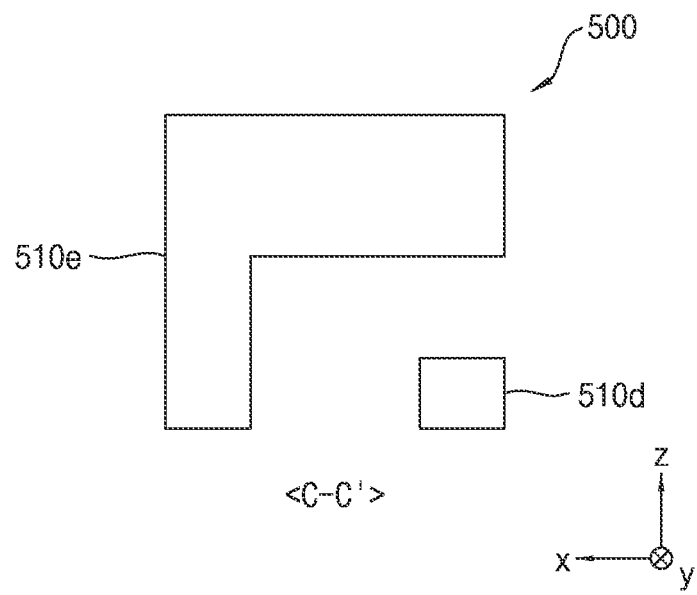
FIG. 5B is a diagram illustrating a front view of a cross-coupled gate circuit provided in a 3D stacked device taken along the line C-C' shown in FIG. 5A, according to another embodiment.

FIG. 5A is a diagram illustrating a top view of a cross-coupled gate circuit provided in a 3D stacked device according to another embodiment; FIG. 5B is a diagram illustrating a front view of a cross-coupled gate circuit provided in a 3D stacked device taken along the line C-C' shown in FIG. 5A, according to another embodiment; and FIG. 5C is a diagram illustrating a perspective view of a cross-coupled gate circuit provided in a 3D stacked device according to another embodiment.

Figure 5C:
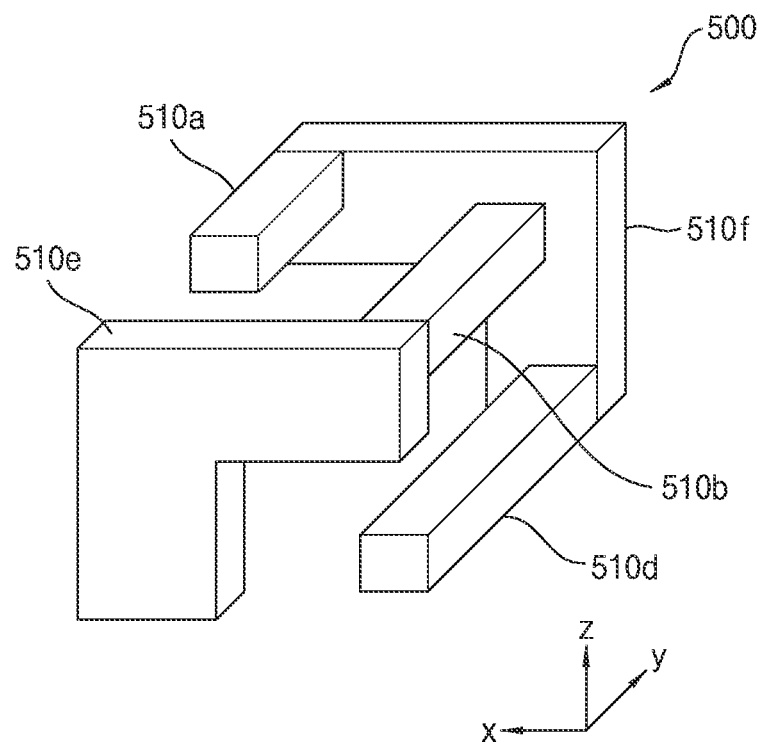
FIG. 5C is a diagram illustrating a perspective view of a cross-coupled gate circuit provided in a 3D stacked device according to another embodiment.

Referring to FIGS. 5A to 5C, a cross-coupled gate circuit 500 may include a first gate, a second gate and one or more channels 520. The one or more channels 520 may be disposed so as to pass through the first gate and the second gate, and extend in a horizontal direction (i.e., x-axis). Here, the cross-coupled gate circuit 500 may not include any conductor. Instead, the first gate and the second gate may be designed such that each of the first gate and the second gate serves as a single component including two gates. In other words, the first gate itself may correspond to the structure of the second gate 410b coupled with the third gate 410c through the first conductor 430 shown in FIG. 4C. The second gate itself may correspond to the structure of the first gate 410a coupled with the fourth gate 410d through the second conductor 440 shown in FIG. 4C.

For the convenience of description, the first gate and the second gate are divided into different parts.

According to an embodiment, the first gate may include a first base portion 510e, a second portion 510b and a third portion 510c. The second gate may include a second base portion 510f, a first portion 510a and a fourth portion 510d.

The second portion 510b extends in the y-direction from the first base portion 510e toward the second base portion 510f, and is disposed at the upper-right region of the base portion 510e. The third portion 510c also extends in the y-direction from the first base portion 510e toward the second base portion 510f, and is disposed at the lower-left region of the first base portion 510e.

The first portion 510a extends in the y-direction from the second base portion 510f toward the first base portion 510e, and is disposed at the upper-left region of the second base portion 510f. The fourth portion 510d extends in the y-direction from the second base portion 510f toward the first base portion 510e, and is disposed at the lower-right region of the second base portion 510f.

Although the first gate and the second gate of the cross-coupled gate circuit 500 are described as having different portions or parts, it should be understood that each of the first gate and the second gate of the cross-coupled gate circuit 500 is a uniform structure. In other words, the first gate and the second gate of the cross-coupled gate circuit 500 are divided into parts only for the purpose of the description.

Moreover, the first gate and the second gate of the cross-coupled gate circuit 500 may be fabricated by performing at least two gate cuttings S1 and S2. For example, a first gate cutting S1 may be performed on the top gates (i.e., the first portion 510a and the second portion 510b) so as to separate the first portion 510*a* from the first base portion 510*e* and separate the second portion 510*b* from the second base portion 510*f*.

Next, a second gate cutting S2 may be performed on the bottom gates (i.e., the third portion 510*c* and the fourth portion 510*d*) so as to separate the third portion 510*c* from the second base portion 510*f* and separate the fourth portion 510*d* from the first base portion 510*e*. Here, prior to performing the second gate cutting S2, a carrier substrate on which the cross-coupled circuit 500 is disposed may be flipped upside down, so that the second gate cutting S2 on the bottom gates may be performed. However, it should be understood that the method of manufacturing or fabricating the cross-coupled circuit 500 is not limited thereto, and may include any other method to fabricate the cross-coupled circuit 500 shown in FIGS. 5A to 5C.

Figure 6A:
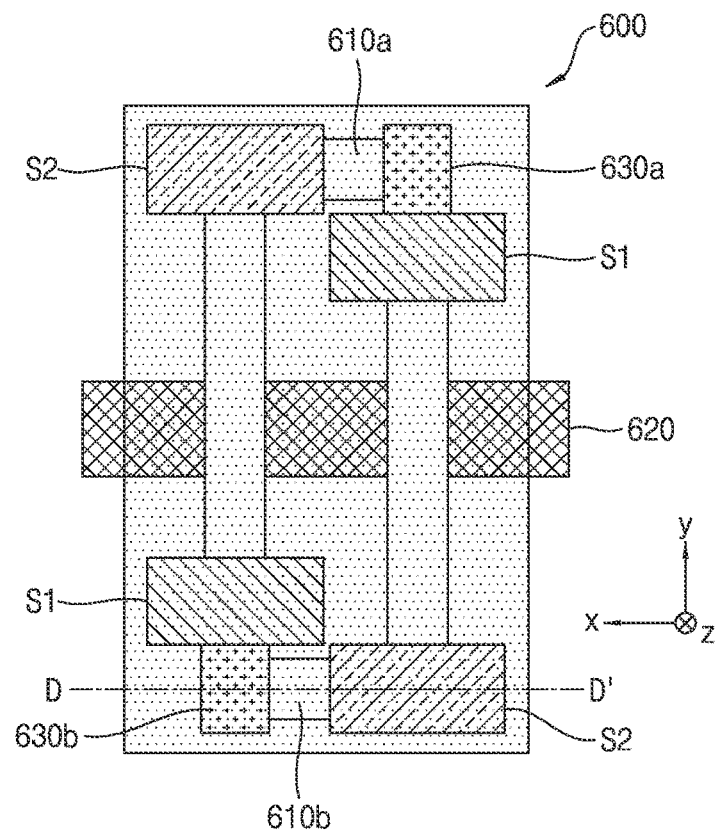
FIG. 6A is a diagram illustrating a top view of a cross-coupled gate circuit provided in a 3D stacked device according to another embodiment.
Figure 6B:
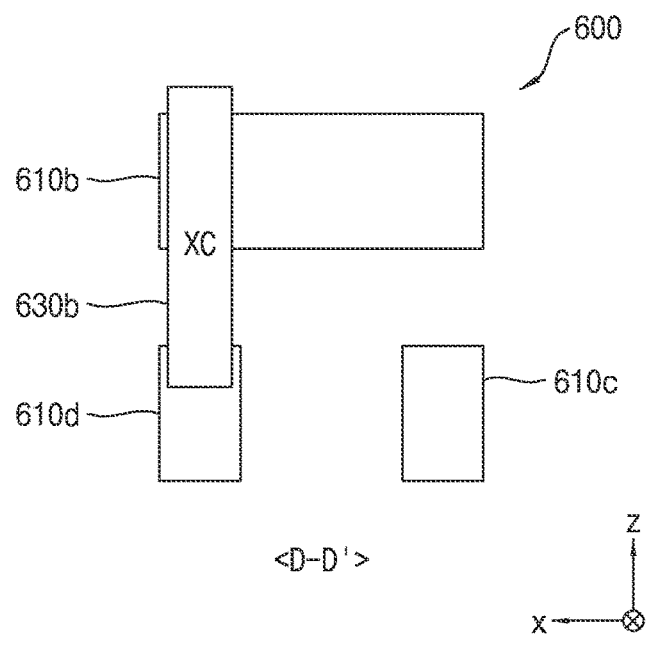
FIG. 6B is a diagram illustrating a front view of a cross-coupled gate circuit provided in a 3D stacked device taken along the line D-D' shown in FIG. 6A, according to another embodiment.

FIG. 6A is a diagram illustrating a top view of a cross-coupled gate circuit provided in a 3D stacked device according to another embodiment; FIG. 6B is a diagram illustrating a plan view of a cross-coupled gate circuit provided in a 3D stacked device taken along the line D-D' shown in FIG. 6A, according to another embodiment; and FIG. 6C is a diagram illustrating a perspective view of a cross-coupled gate circuit provided in a 3D stacked device according to another embodiment.

Figure 6C:
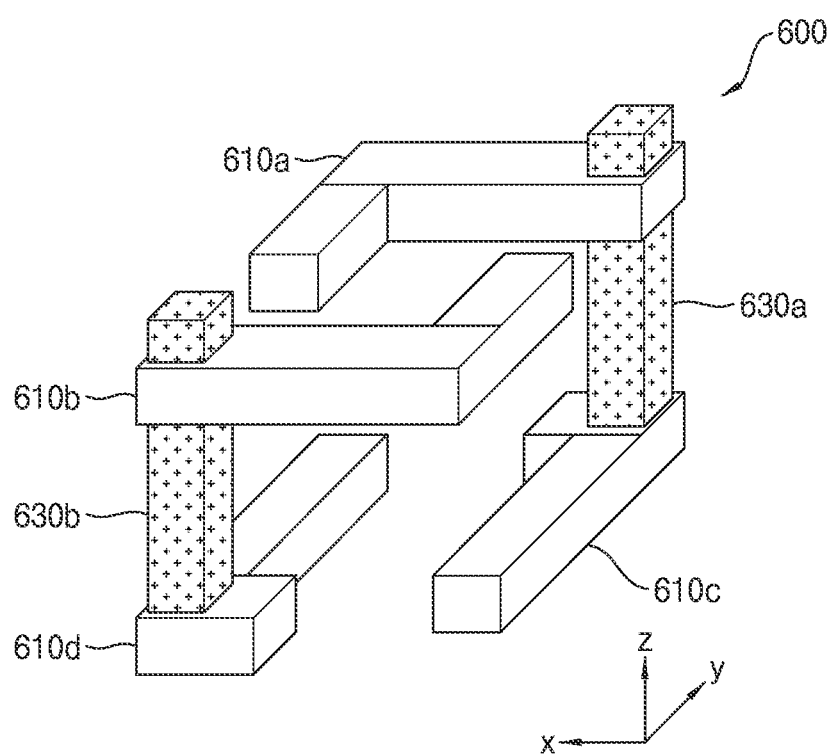
FIG. 6C is a diagram illustrating a perspective view of a cross-coupled gate circuit provided in a 3D stacked device according to another embodiment.

Referring to FIGS. 6A to 6C, a cross-coupled gate circuit 600 may include a first gate 610*a*, a second gate 610*b*, a third gate 610*c*, a fourth gate 610*d*, a first via 630*a* and a second via 630*b*. In this embodiment, each of the first gate 610*a*, the second gate 610*b*, the third gate 610*c* and the fourth gate 610*d* may be formed into an "L" shape. The first gate 610*a* may be coupled to the third gate 610*c* by the first via 630*a*. Here, the first via 630*a* extends along the z-axis from the third gate 610*c* to the first gate 610*a* so as to couple the first gate 610*a* and the third gate 610*c*. The second gate 610*b* may be coupled to the fourth gate 610*d* by the second via 630*b*. Here, the second via extends along the z-axis from the fourth gate 610*d* to the second gate 610*b*. As shown in FIG. 6C, the first via 630*a* and the second via 630*b* may be disposed such that the first via 630*a* penetrates the first gate 610*a* and the second via 630*b* penetrates the second gate 610*b*. However, the one or more embodiments are not limited thereto, and the first via 630*a* and the second via 630*b* may be variously formed so as to couple the respective gates.

Moreover, the first gate 610*a*, the second gate 610*b*, the third gate 610*c* and the fourth gate 610*d* may be formed into an "L" shape by performing a first gate cutting S1 on the top gates (i.e., the first gate 610*a* and the second gate 610*b*) and a second gate cutting S2 on the bottom gates (i.e., the third gate 610*c* and the fourth gate 610*d*). For example, referring to FIG. 6A, the first gate cutting S1 may be performed on the top gates in regions indicated as S1, to separate the first gate 610*a* from the second gate 610*b*. The second gate cutting S2 may be performed on the bottom gates in regions indicated as S2, to separate the third gate 610*c* and the fourth gate 610*d*. Here, prior to performing the second gate cutting S2, a carrier substrate on which the cross-coupled circuit 600 is disposed may be flipped upside down, so that the second gate cutting S2 on the bottom gates may be performed. However, it should be understood that the method of manufacturing or fabricating the cross-coupled circuit 600 is not limited thereto, and may include any other method to fabricate the cross-coupled circuit 600 shown in FIGS. 6A to 6C.

FIGS. 7A through 7D are diagrams illustrating a manufacturing process of a cross-coupled gate circuit shown in FIG. 2D, according to an embodiment.

Step S701

Figure 7A:
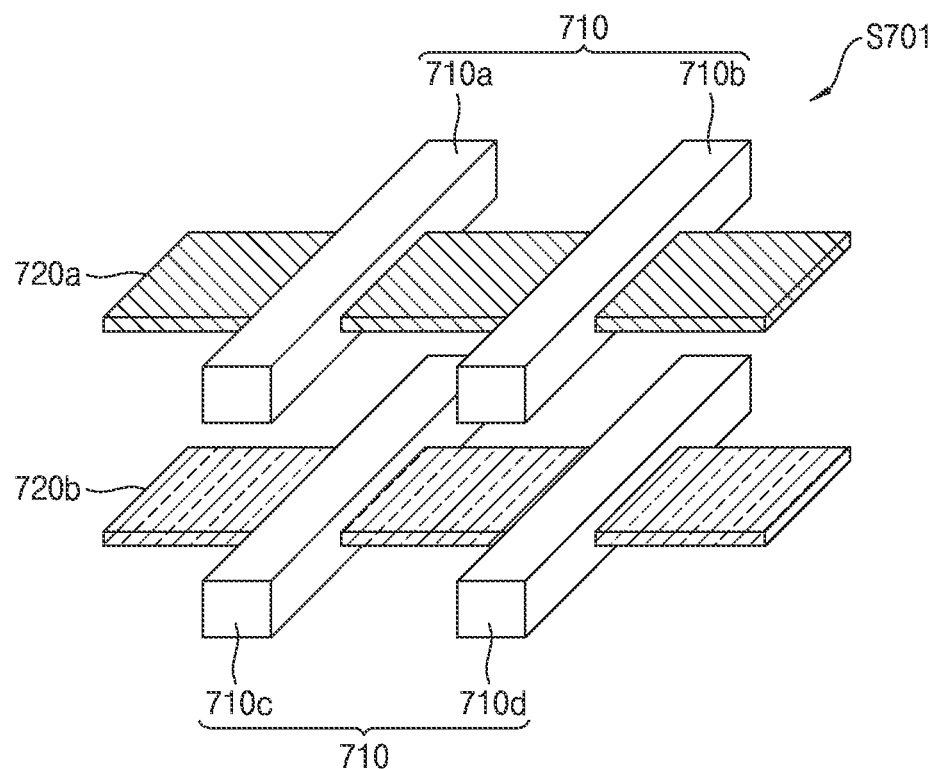
FIGS. 7A through 7D are diagrams illustrating a manufacturing process of a cross-coupled gate circuit shown in FIG. 2D, according to an embodiment.

Referring to FIG. 7A, a plurality of gates 710 including a first gate 710*a*, a second gate 710*b*, a third gate 710*c* and a fourth gate 710*d* may be provided on a carrier substrate. Here, the first gate 710*a* and the second gate 710*b* may be collectively referred to as "top gates", and the third gate 710*c* and the fourth gate 710*d* may be collectively referred to as "bottom gates". A first channel 720*a* may be disposed such that it passes through the top gates. A second channel 720*b* may be disposed such that it passes through the bottom gates.

Step S702

Figure 7B:
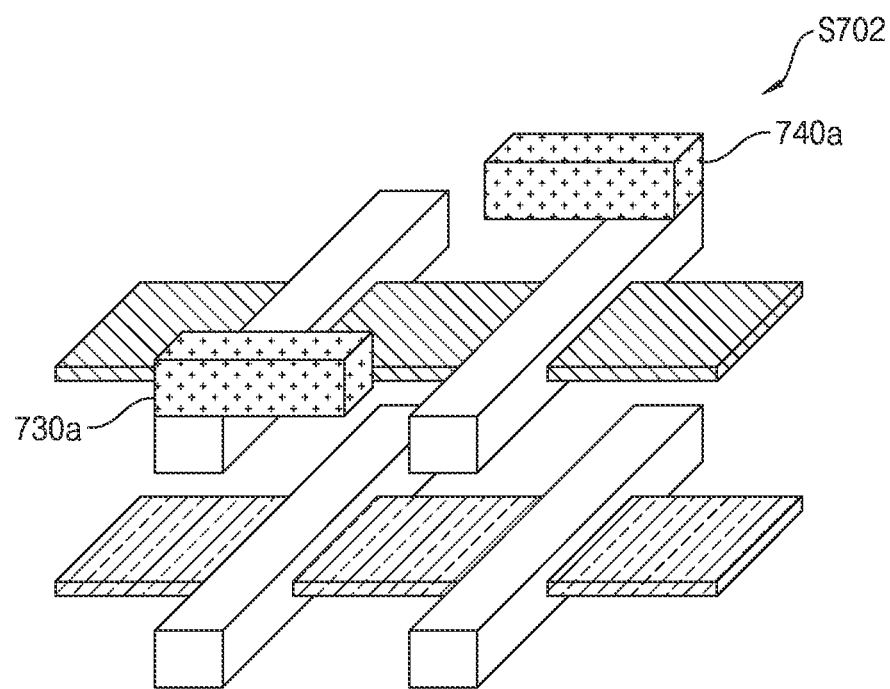

Referring to FIG. 7B, a first contact region 730*a* may be disposed on the first gate 710*a* such that one end portion of the first contact region 730*a* is disposed on the top surface of the first gate 710*a*, and the first contact region 730*a* extends from the first gate 710*a* toward the second gate 710*b*. Similarly, a second contact region 740*a* may be disposed on the second gate 710*b* such that one end portion of the second contact region 740*a* is disposed on the top surface of the second gate 710*b*, and the second contact region 740*a* extends from the second gate 710*b* toward the first gate 710*a*.

Step S703

Figure 7C:
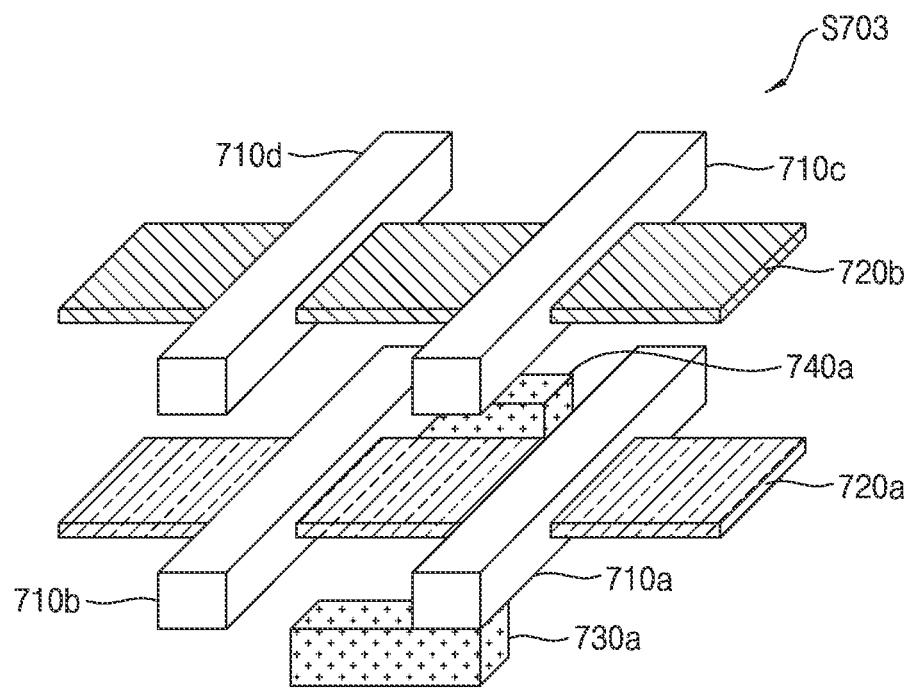

Referring to FIG. 7C, the carrier substrate may be flipped upside down such that the top gates (i.e., the first gate 710*a* and the second gate 710*b*) are positioned underneath the bottom gates (i.e., the third gate 710*c* and the fourth gate 710*d*).

Step S704

Figure 7D:
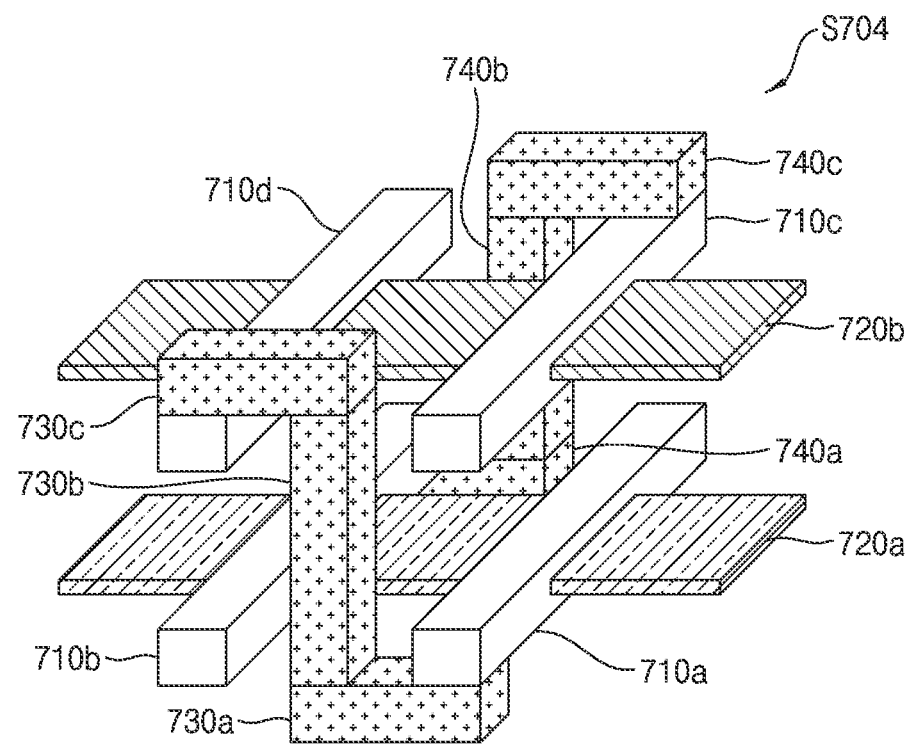

Referring to FIG. 7D, a first via 730*b* may be disposed on the other end portion of the first contact region 730*a*, and vertically extend from the first contact region 730*a*. Thereafter, a third contact region 730*c* may be disposed so as to connect the fourth gate 710*d* and the first via 730*b*. That is, one end portion of the third contact region 730*c* may be disposed on top of the first via 730*b* and the other end portion of the third contact region 730*c* may be disposed on a top surface of the fourth gate 710*d*. Also, a second via 740*b* may be disposed on the other end portion of the second contact region 740*a*, and vertically extend from the second contact region 740*a*. A fourth contact region 740*c* may be disposed so as to connect the third gate 710*c* and the second gate 710*b*. That is, one end portion of the fourth contact region 740*c* may be disposed on top of the second via 740*b* and the other end portion of the fourth contact region 740*c* may be disposed on a top surface of the third gate 710*c*. As a result, when the carrier substrate carrying the cross-coupled circuit is flipped upside down again, the 3D stacked cross-coupled gate circuit 200 shown in FIG. 2D may be fabricated.

FIGS. 8A through 8D are diagrams illustrating a manufacturing process of a cross-coupled gate circuit shown in FIG. 4C, according to an embodiment.

Step S801

Figure 8A:
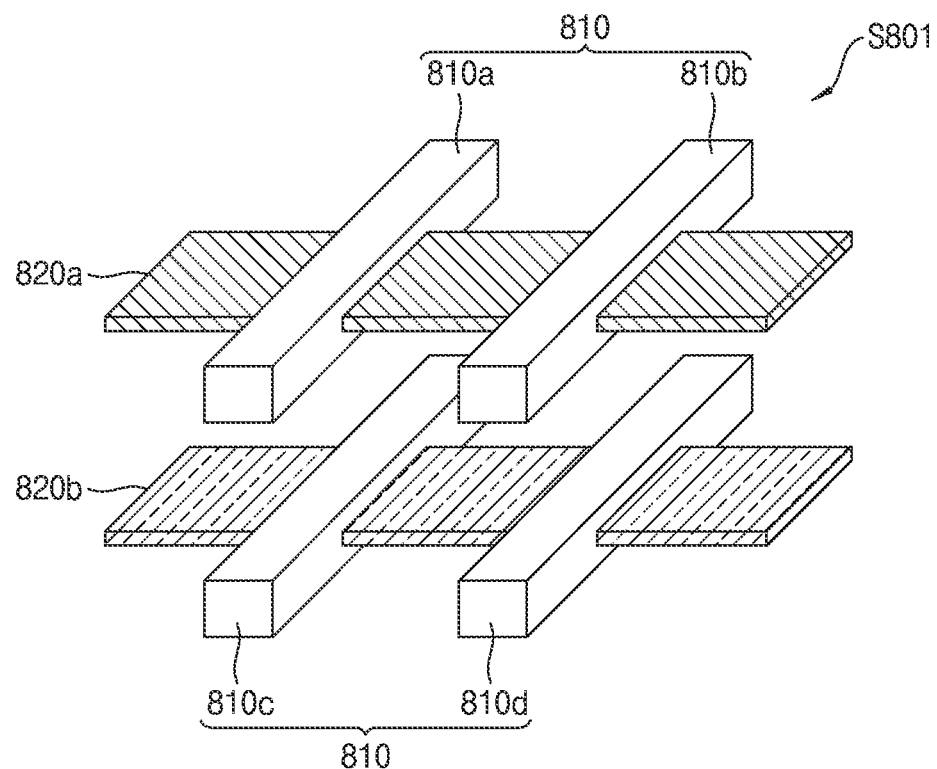
FIGS. 8A through 8D are diagrams illustrating a manufacturing process of a cross-coupled gate circuit shown in FIG. 4C, according to an embodiment.

Referring to FIG. 8A, a plurality of gates 810 including a first gate 810*a*, a second gate 810*b*, a third gate 810*c* and a fourth gate 810*d* may be provided on a carrier substrate. The first gate 810*a* and the second gate 810*b* may be collectively referred to as "top gates", and the third gate 810*c* and the fourth gate 810*d* may be collectively referred to as "bottom gates". A first channel 820*a* may be disposed such that it passes through the top gates. A second channel 820*b* may be disposed such that it passes through the bottom gates.

Step S802

Figure 8B:
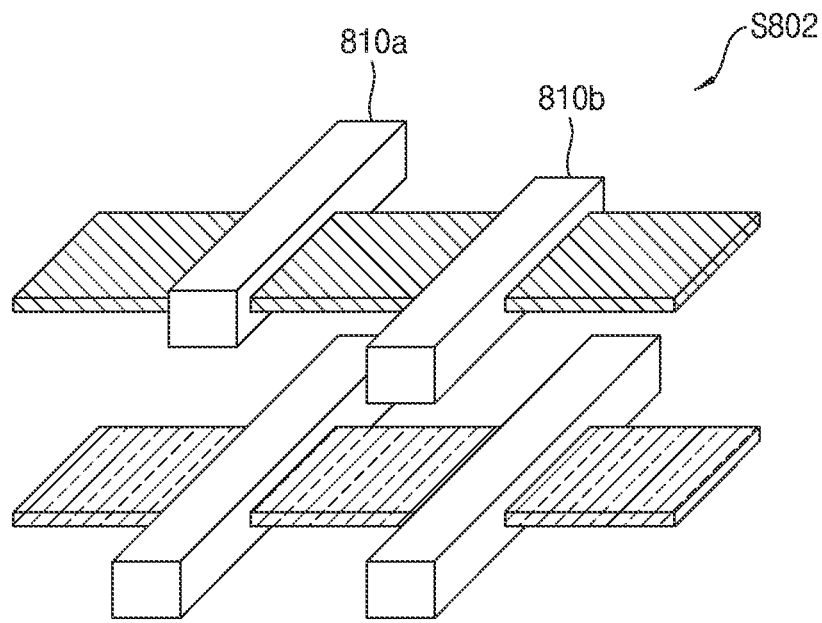

Referring to FIG. 8B, the gate cutting S1 may performed on the first gate 810*a* and the second gate 810*b*, as described above with reference to FIG. 4A. Here, a front-end portion of the first gate 810a is cut and a back-end portion of the second gate 810b is cut in the gate cutting S1.

Step S803

Figure 8C:
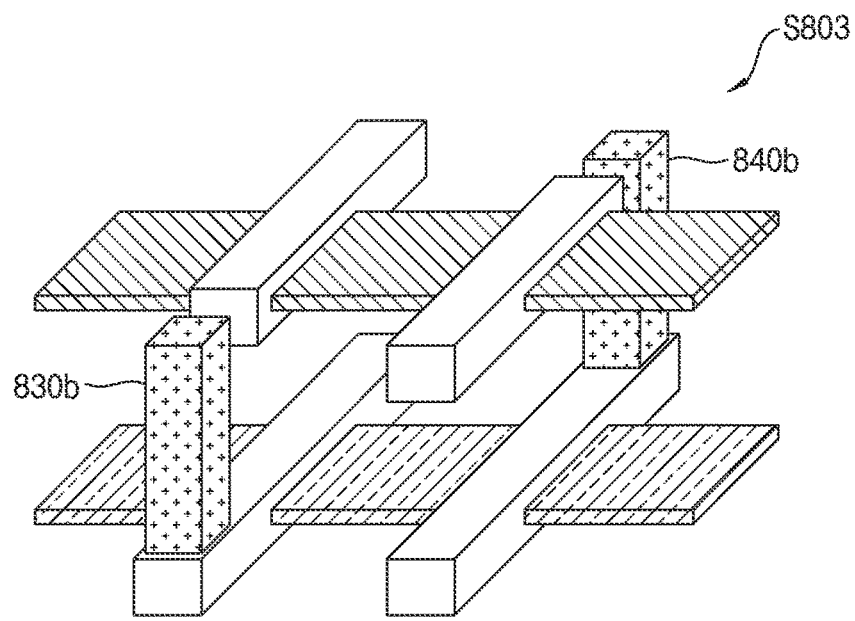

Referring to FIG. 8C, a first via 830b may be disposed on a top surface of the third gate 810c and extend vertically from the third gate 810c. A second via 840b may be disposed on a top surface of the fourth gate 810d and extend vertically from the fourth gate 810d. Here, the first via 830b and the second via 840b may be disposed such that they are not in contact with the first gate 810a and the second gate 810b, respectively.

Step S804

Figure 8D:
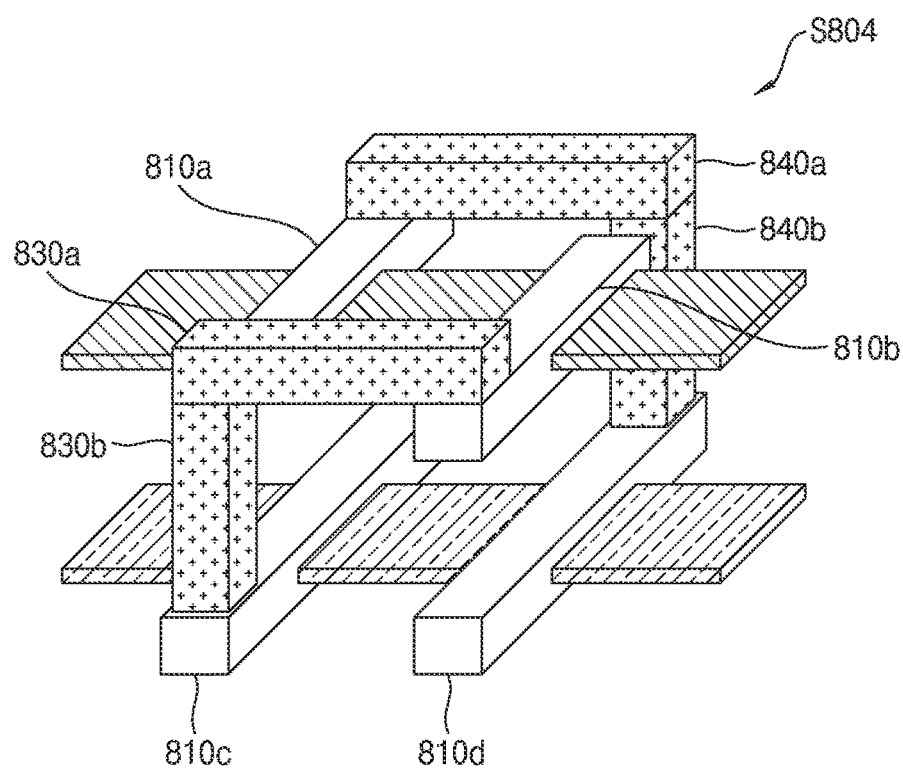

Referring to FIG. 8D, one end portion of a first contact region 830a may be disposed on top of the first via 830b and the other end portion of the first contact region 830a may be disposed on a top surface of the second gate 810b, thereby coupling the second gate 810b and the third gate 810c. Also, one end portion of a second contact region 840a may be disposed on top of the second via 840b and the other end portion of the second contact region 840a may be disposed on a top surface of the first gate 810a, thereby coupling the first gate 810a and the fourth gate 810d. As a result, the 3D stacked cross-coupled gate circuit 400 shown in FIG. 4C may be fabricated.

FIGS. 9A through 9D are diagrams illustrating a manufacturing process of a cross-coupled gate circuit shown in FIG. 5C, according to an embodiment.

Step S901

Figure 9A:
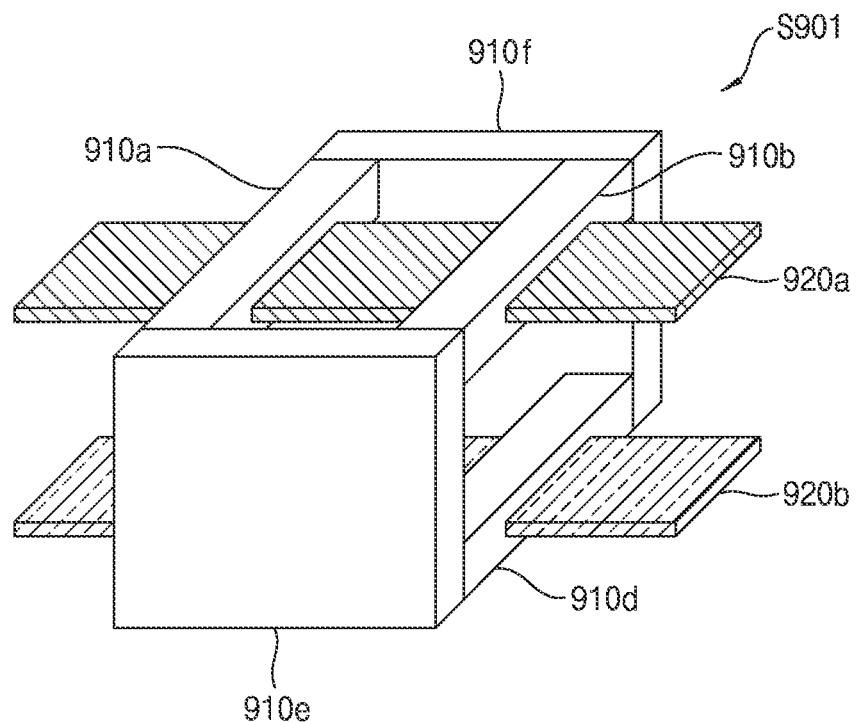
FIGS. 9A through 9D are diagrams illustrating a manufacturing process of a cross-coupled gate circuit shown in FIG. 5C, according to an embodiment.

Referring to FIG. 9A, a first gate 910a, a second gate 910b, a third gate 910c, a fourth gate 910d, a first base gate 910e and a second base gate 910f may be provided on a carrier substrate. A first channel 920a may extend horizontally and pass through the first gate 910a and the second gate 910b. A second channel 920b may extend horizontally and pass through the third gate 910c (not shown) and the fourth gate 910d. Moreover, a first side surface of the first gate 910a, the second gate 910b, the third gate 910c and the fourth gate 910d may be connected to the first base gate 910e. A second side surface of the first gate 910a, the second gate 910b, the third gate 910c and the fourth gate 910d may be connected to the second base gate 910f, where the second side surface is a surface opposite to the first side surface.

Although the gates 910 are divided into different parts, it should be understood that the first gate 910a, the second gate 910b, the third gate 910c, the fourth gate 910d, the first base gate 910e and the second base gate 910f may be made of the same or different material. In other words, the gates 910 according to an embodiment may be a single uniform structure.

Step S902

Figure 9B:
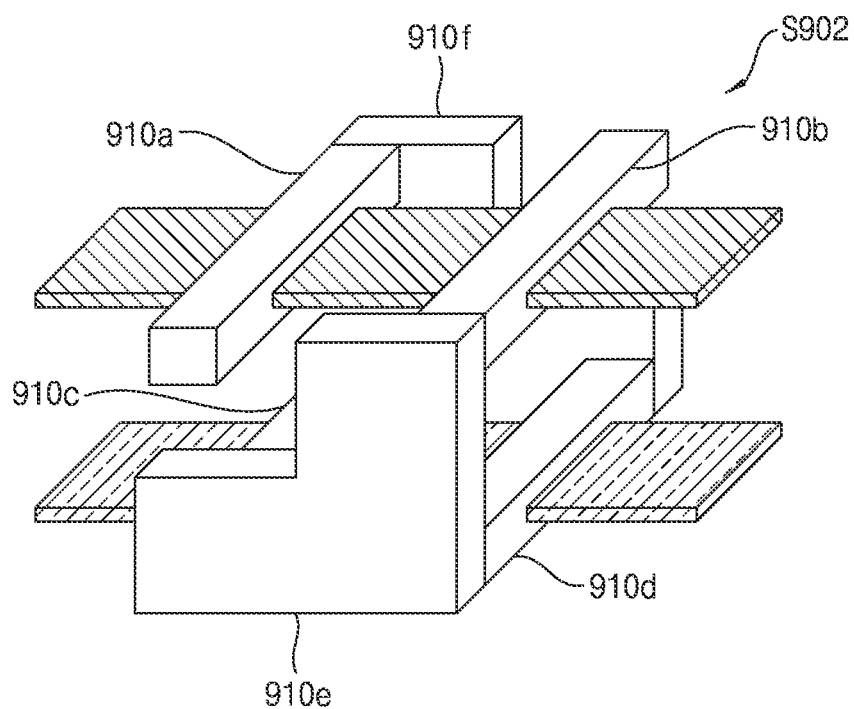

Referring to FIG. 9B, a first gate cutting S1 may be performed. In the first gate cutting S1, a portion of the first base gate 910e adjacent to the first gate 910a and a portion of the second base gate 910f adjacent to the second gate 910b may be cut, thereby separating the first gate 910a from the first base gate 910e and separating the second gate 910b from the second base gate 910f.

Step S903

Figure 9C:
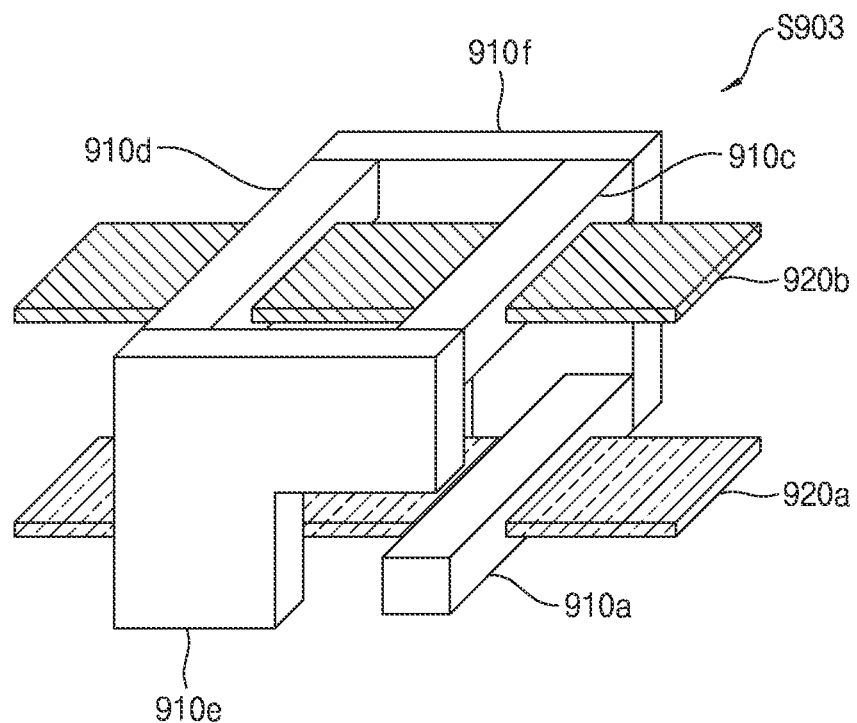

Referring to FIG. 9C, the carrier substrate may be flipped or turned upside down such that the top gates (i.e., the first gate 910a and the second gate 910b) are positioned underneath the bottom gates (i.e., the third gate 910c and the fourth gate 910d).

Step S904

Figure 9D:
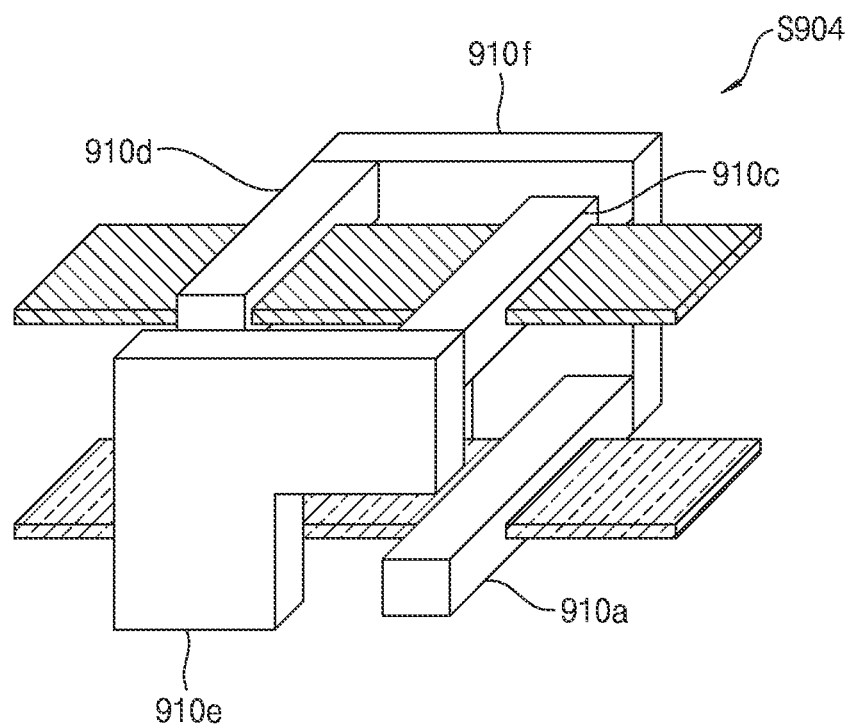

Referring to FIG. 9D, a second gate cutting S2 may be performed. In the second gate cutting S2, a portion of the third gate 910c and a portion of the fourth gate 910d are cut such that the third gate 910c is separated from the second base gate 910f and the fourth gate 910d is separated from the first base gate 910e. As a result, the 3D stacked cross-coupled gate circuit 500 shown in FIG. 5C may be fabricated.

FIGS. 10A through 10E are diagrams illustrating a manufacturing process of a cross-coupled gate circuit shown in FIG. 6C, according to an embodiment.

Step S1001

Figure 10A:
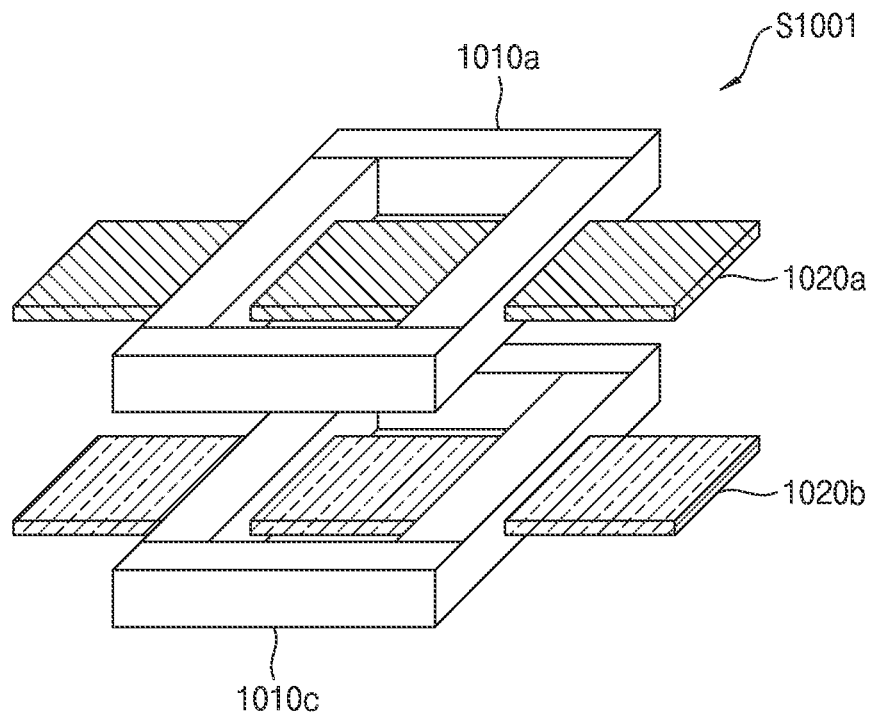
FIGS. 10A through 10E are diagrams illustrating a manufacturing process of a cross-coupled gate circuit shown in FIG. 6C, according to an embodiment.

Referring to FIG. 10A, a first gate 1010a and a third gate 1010c may be provided on a carrier substrate. Here, each of the first gate 1010a and the third gate 1010c may be in a ring-like structure. A channel 1020a may pass through the first gate 1010a and a channel 1020b may pass through the third gate 1010c.

Step S1002

Figure 10B:
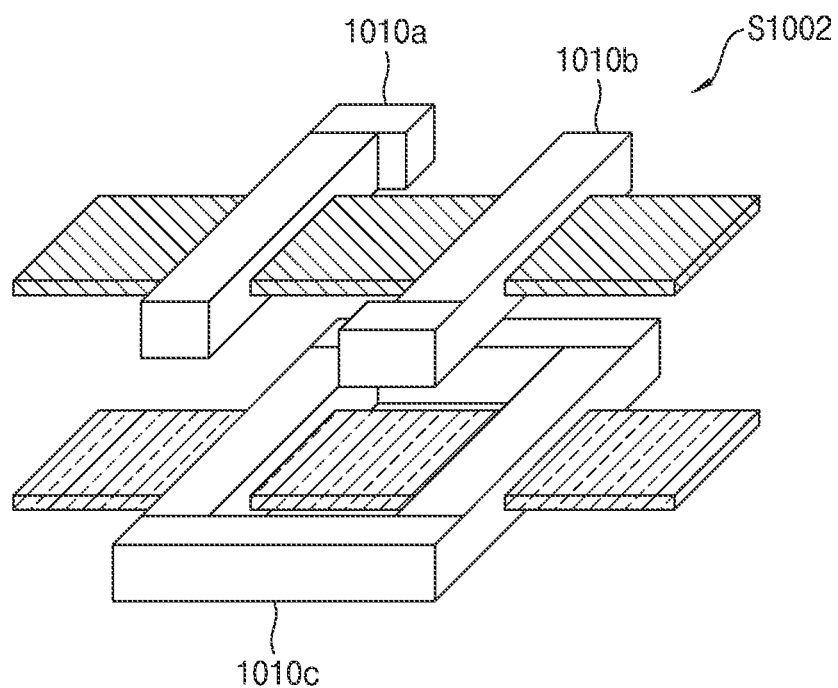

Referring to FIG. 10B, a first gate cutting S1 may be performed on the first gate 1010a such that the first gate 1010a is separated or divided into the first gate 1010a and a second gate 1010b.

Step S1003

Figure 10C:
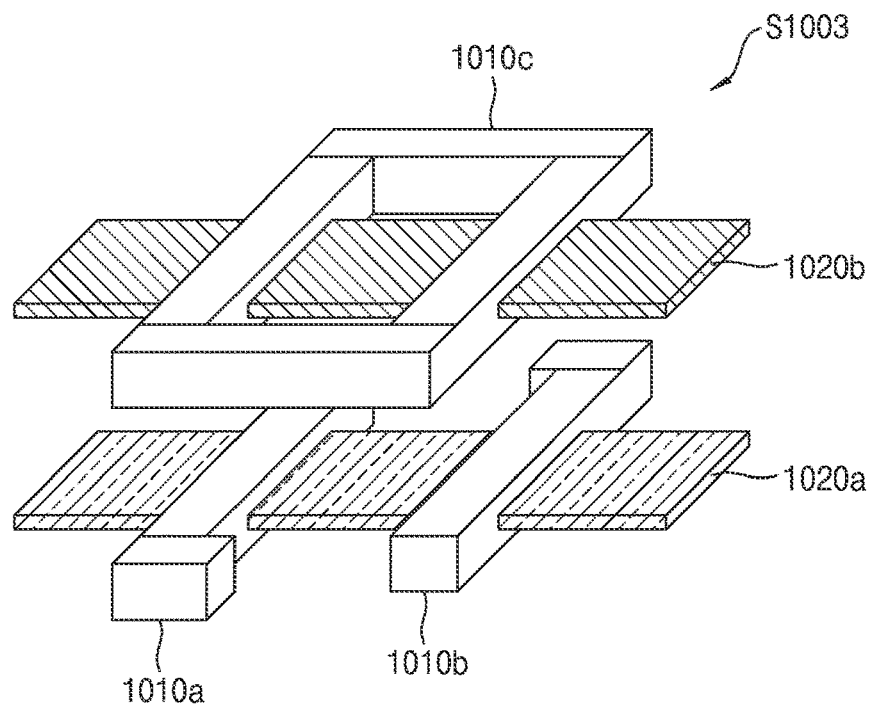

Referring to FIG. 10C, the carrier substrate may be turned upside down such that the first gate 1010a and the second gate 1010b are disposed underneath the third gate 1010c.

Step S1004

Figure 10D:
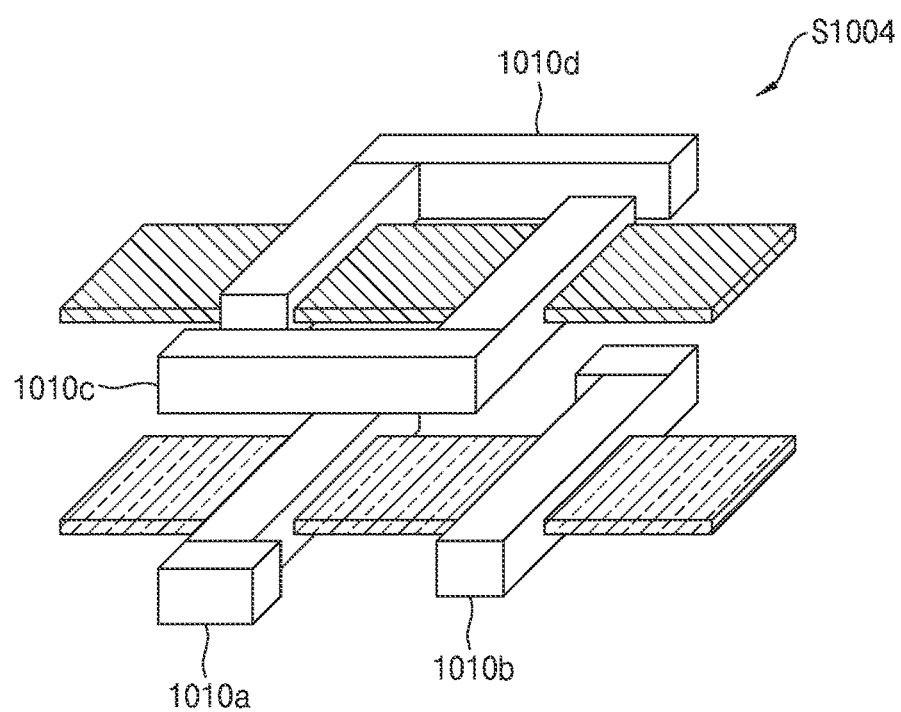

Referring to FIG. 10D, a second gate cutting S2 may be performed on the third gate 1010c such that the third gate 1010c is separated or divided into the third gate 1010c and a fourth gate 1010d. As shown in FIG. 10D, the first gate 1010a, the second gate 1010b, the third gate 1010c and the fourth gate 1010d are formed into an "L" shape after the first gate cutting S1 and the second gate cutting S2. However, it should be understood that one or more embodiments of the disclosure are not limited thereto, and may include any other shape.

Step S1005

Figure 10E:
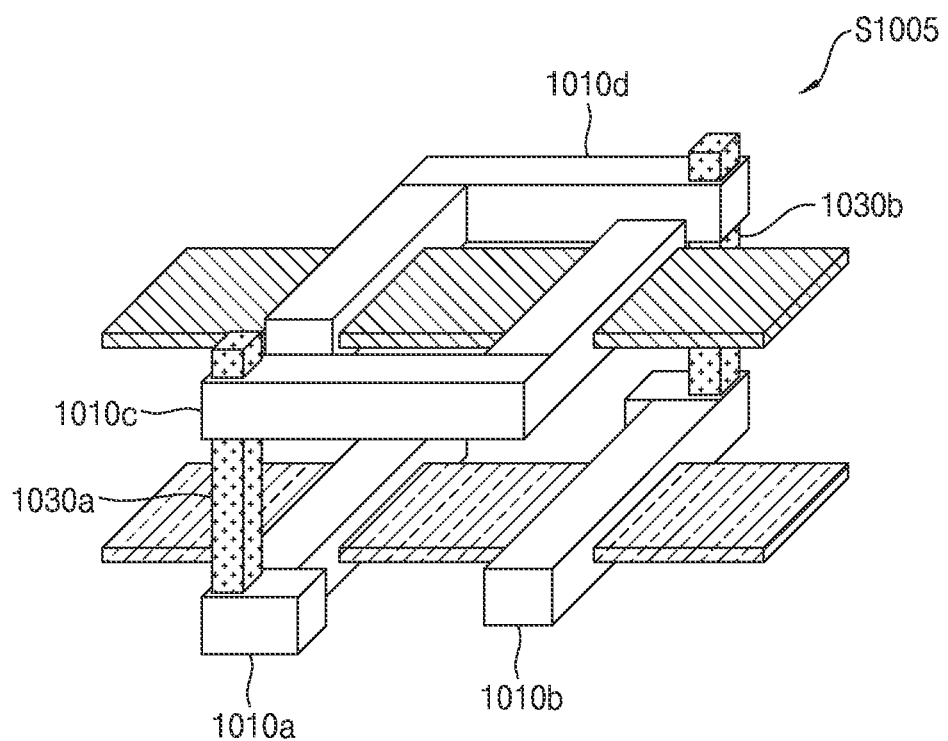

Referring to FIG. 10E, a first via 1030a may be vertically disposed so as to connect the first gate 1010a and the third gate 1010c. Similarly, a second via 1030b may be vertically disclosed so as to connect the second gate 1010b and the fourth gate 1010d. As a result, the 3D stacked cross-coupled gate circuit of FIG. 6C may be formed.

Figure 11:
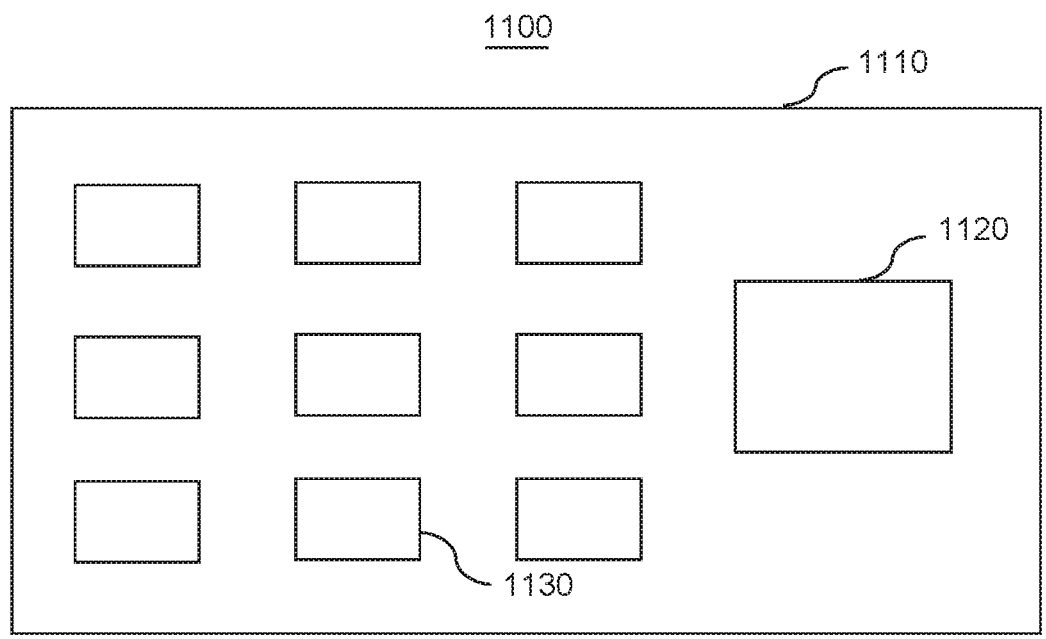
FIG. 11 is a diagram illustrating a schematic plan view of a semiconductor module according to an embodiment.

FIG. 11 is a diagram illustrating a schematic plan view of a semiconductor module according to an embodiment.

Referring to FIG. 11, a semiconductor module 1100 according to an embodiment may include a processor 1120 and semiconductor devices 1130 that are mounted on a module substrate 1110. The processor 1120 and/or the semiconductor devices 1130 may include one or more one or more cross-coupled gate circuits in a 3D stacked device described in the above embodiments.

Figure 12:
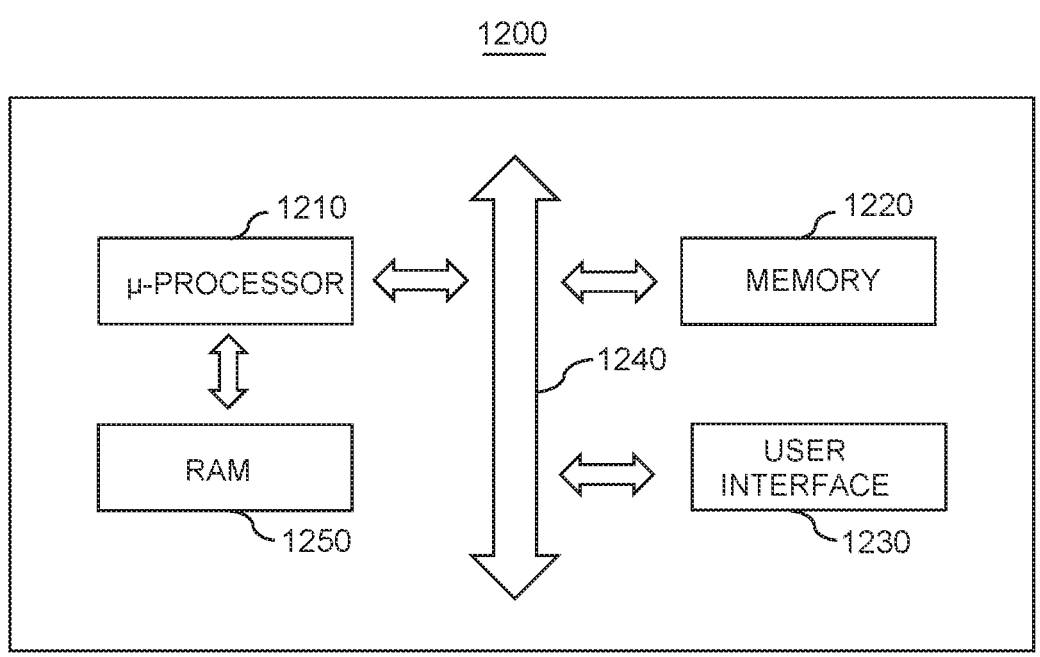
FIG. 12 is a schematic block diagram of an electronic system according to an embodiment.

FIG. 12 is a schematic block diagram of an electronic system according to an embodiment.

Referring to FIG. 12, an electronic system 1200 in accordance with an embodiment may include a microprocessor 1210, a memory 1220, and a user interface 1230 that perform data communication using a bus 1240. The microprocessor 1210 may include a central processing unit (CPU) or an application processor (AP). The electronic system 1200 may further include a random access memory (RAM) 1250 in direct communication with the microprocessor 1210. The microprocessor 1210 and/or the RAM 1250 may be implemented in a single module or package. The user interface 1230 may be used to input data to the electronic system 1200, or output data from the electronic system 1200. For example, the user interface 1230 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 1220 may store operational codes of the microprocessor 1210, data processed by the microprocessor 1210, or data received from an external device. The memory 1220 may include a memory controller, a hard disk, or a solid state drive (SSD).

At least the microprocessor 1210, the memory 1220 and/or the RAM 1250 in the electronic system 1200 may include one or more cross-coupled gate circuits in a 3D stacked device described in the one or more embodiments of the disclosure.

Some of the embodiments of the disclosure have been shown and described above. However, the one or more embodiments of the disclosure are not limited to the aforementioned specific embodiments. It may be understood that various modifications, substitutions, improvements and equivalents thereof can be made without departing from the spirt and scope of the disclosure. It should be understood that such modifications, substitutions, improvements and equivalents thereof shall fall within the protection scope of the disclosure, and should not to be construed independent from the inventive concept or prospect of the disclosure.

What is claimed is:

1. A semiconductor device comprising:
   a cross-coupled gate circuit in a three-dimensional (3D) stack including a plurality of transistors;
   a first gate line of a first transistor among the plurality of transistors connected to a fourth gate line of a fourth transistor among the plurality of transistors;
   a second gate line of a second transistor among the plurality of transistors connected to a third gate line of a third transistor among the plurality of transistors;
   a first conductor connecting the first gate line to the fourth gate line;
   a second conductor connecting the second gate line to the third gate line;
   wherein the first gate line and the second gate line are arranged above the third gate line and the fourth gate line, respectively,
   wherein at least a portion of the first conductor extends vertically to connect the first gate line to the fourth gate line, and at least a portion of the second conductor extends vertically to connect the second gate line to the third gate line,
   wherein the first conductor comprises:
      at least one of a first contact formed on the first gate line and extending toward the second gate line in a horizontal direction, and a third contact formed on the fourth gate line and extending toward the third gate line in the horizontal direction; and
      a first via connecting the first gate line to the fourth gate line in a vertical direction through the at least one of the first contact and the third contact, and
   wherein the second conductor comprises:
      at least one of a second contact formed on the second gate line and extending toward the first gate line in the horizontal direction, and a fourth contact formed on the third gate line and extending toward the fourth gate line in the horizontal direction; and
      a second via connecting the second gate line to the third gate line in the vertical direction though the at least one of the second contact and the fourth contact.

2. The semiconductor device of claim 1, wherein the plurality of transistors comprise:
   at least two n-type metal oxide semiconductor (NMOS) transistors and at least two p-type metal oxide semiconductor (PMOS) transistors,
   wherein the first transistor and the second transistor are NMOS transistors, and the third transistor and the fourth transistor are PMOS transistors.

3. The semiconductor device of claim 1, further comprising:
   a first channel layer passing through the first gate line and the second gate line; and
   a second channel layer passing through the third gate line and the fourth gate line.

4. The semiconductor device of claim 3, wherein the first gate line, the second gate line, the third gate line and the fourth gate line extend in a first direction, and
   wherein the first channel layer and the second channel layer extend in a second direction perpendicular to the first direction.

5. The semiconductor device of claim 1, wherein the first gate line and the fourth gate line have a substantially equal length in another horizontal direction perpendicular to the horizontal direction in which the at least one of the first contact and the third contact is extended.

6. The semiconductor device of claim 5, wherein the second gate line and the third gate line have a substantially equal length in the other horizontal direction.

7. The semiconductor device of claim 1, wherein the first gate line and the third gate line are vertically overlapping each other, and the second gate line and the fourth gate line are vertically overlapping each other.

8. The semiconductor device of claim 7, wherein the first gate line has a smaller length than the third gate line in another horizontal direction perpendicular to the horizontal direction in which the at least one of the first contact and the third contact is extended, and
   wherein the second gate line has a smaller length than the fourth gate line in the other horizontal direction.

9. The semiconductor device of claim 1, wherein the first conductor comprises the first contact, among the first contact and the third contact, and the first via, and
   wherein the second conductor comprises the second contact, among the second contact and the fourth contact, and the second via,
   wherein the first via connects the first contact on the first gate line to the fourth gate line in the vertical direction, and
   wherein the second via connects the second contact on the second gate line to the third gate line in the vertical direction.

10. The semiconductor device of claim 9, wherein the first via and the second via are located between the first gate line and the second gate line.

11. The semiconductor device of claim 9, wherein the first via and the second via are located opposite from each other with respect to a channel layer disposed therebetween.

12. The semiconductor device of claim 1, wherein the first contact is connected to the first gate line, the third contact is connected to the fourth gate line, and the first via connects the first contact to the third contact in the vertical direction, and
   wherein the second contact is connected to the second gate line, the fourth contact is connected to the third gate line, and the second via connects the second contact to the fourth contact in the vertical direction.

13. The semiconductor device of claim 12, wherein the first contact is connected to a top surface of the first gate line and the third contact is connected to a bottom surface of the fourth gate line, and wherein the second contact is connected to a top surface of the second gate line and the fourth contact is connected to a bottom surface of the third gate line.

14. The semiconductor device of claim 12, wherein the first contact is connected to a side surface of the first gate line and the third contact is connected to a side surface of the fourth gate line, and wherein the second contact is connected to a side surface of the second gate line and the fourth contact is connected to a side surface of the third gate line.

* * * * *